United States Patent [19]

Logan

[11] Patent Number: 4,839,274

[45] Date of Patent: Jun. 13, 1989

[54] NOVEL POLYMETHINE DYES AND UV ABSORBERS CONTAINING A TRIARYLBORYLISOCYANO GROUP AND IMAGING COMPOSITIONS CONTAINING THESE DYES

[75] Inventor: Margaret E. Logan, Rochester, N.Y.

[73] Assignee: Eastman Kodak Company, Rochester, N.Y.

[21] Appl. No.: 67,841

[22] Filed: Jun. 30, 1987

[51] Int. Cl.$^4$ .............. G03C 1/71; G03C 1/12; G03C 1/40; C07F 5/02

[52] U.S. Cl. .................. 430/281; 430/270; 430/322; 430/512; 430/570; 430/581; 430/591; 546/13; 548/110; 548/405; 549/4; 549/213; 564/8

[58] Field of Search .............. 430/512, 570, 577, 581, 430/591, 281, 270, 322; 548/110, 405; 549/4, 213; 546/13; 564/8

[56] References Cited

U.S. PATENT DOCUMENTS

| | | | |
|---|---|---|---|
| 2,411,507 | 11/1946 | Collins et al. | 95/7 |
| 2,511,210 | 6/1950 | Kendall et al. | 260/240 |
| 2,693,472 | 11/1954 | Kendall et al. | 260/304 |
| 2,721,799 | 10/1955 | Edwards et al. | 95/7 |
| 3,305,555 | 2/1967 | Stafiej et al. | 546/13 |
| 3,341,582 | 9/1967 | Stafiej et al. | 548/405 |
| 3,855,209 | 12/1974 | Hoyle | 546/13 |
| 4,365,016 | 12/1982 | Detty et al. | 430/83 |
| 4,365,017 | 12/1982 | Detty et al. | 430/83 |
| 4,439,520 | 3/1984 | Kofron et al. | 430/434 |
| 4,576,905 | 3/1986 | Gunther | 430/401 |
| 4,584,258 | 4/1986 | Detty et al. | 430/270 |

FOREIGN PATENT DOCUMENTS 2083832A 3/1982 United Kingdom.

OTHER PUBLICATIONS

The Theory of the Photographic Process; 4th ed. by T. H. James; 1977; pp. 195-196.

Hamer, *Cyanine Dyes and Related Compounds*, Chapter XIV, John Wiley & Sons, pp. 595-604.

*Research Disclosure*, Dec., 1978, vol. 176, Item 17643, Section IV, Paragraph C.

*Research Disclosure*, vol. 200, Dec. 1980, Item 20036.

U. Schollkopf, "Recent Applications of $\alpha$-Metalated Isocyanides in Organic Synthesis", *Angew. Chem., Int. Ed.*, 1977, 16, 339-422.

R. H. Hall et al, "Synthesis of C-Glycosyl Compounds. Part 1. Reaction of Ethylisocyanoacetate with 2,3,5,6-Di-O-isopropylidene-D-Mannono-1,4-lactone", *J. Chem. Soc., Perkin Trans. 1*, 1977, 743-753.

C. Herdies et al, "Heterocyclic Substituted Amino Acids via $\alpha,\beta$-Dehydroamino Acid Derivatives. Studies on Amino Acids", *Heterocycles*, 1983, 20, 2163-2167

C. Herdeis et al, "Platin(II)-Komplexe Von Vinylogen Aminoisocyanides", *Chem. Ber.*, 1983, 116, 3205-3211.

Schollkopf et al, "Synthesis with $\alpha$-Metalated Isocyanides, XLIV. Note on $\beta$-Dimethyl-amino-$\alpha$-isocyanoacrylates and Their Use in Heterocyclic Chemistry", *Justus Liebigs Ann. Chem.*, 1979, 1444-6.

Hoppe, "$\alpha$-Metalated Isocyanides in Organic Synthesis", *Angew. Chem. Int. Ed.*, 1974, 13, 789-804.

I. Hoppe and U. Schollkopf, "Synthesis and Biological Activites of the Antibiotic B 371 and its Analogs", *Justus Liebigs Ann. Chem.*, 1984, 600-607.

Ugi *Isonitrile Chemistry*, Chapter 6, "The Reaction of Isonitriles with Boranes", Academic Press, 1971, New York and London.

*Primary Examiner*—Roland E. Martin
*Assistant Examiner*—Mark R. Buscher
*Attorney, Agent, or Firm*—Carl O. Thomas

[57] ABSTRACT

Polymethine dyes and ultraviolet absorbers are disclosed containing a basic electron donating terminal nucleus and an acidic electron accepting terminal nucleus comprised of a triarylborylisocyano group. The dyes are useful in imaging materials.

18 Claims, No Drawings

NOVEL POLYMETHINE DYES AND UV ABSORBERS CONTAINING A TRIARYLBORYLISOCYANO GROUP AND IMAGING COMPOSITIONS CONTAINING THESE DYES

FIELD OF THE INVENTION

This invention relates to polymethine dyes and ultraviolet absorbers and to imaging compositions and photographic elements containing these dyes and ultraviolet absorbers.

BACKGROUND OF THE INVENTION

Polymethine dyes and ultraviolet (UV) absorbers containing a chromophore formed by an acidic electron accepting terminal nucleus and a basic electron donating terminal nucleus joined through a methine chain are well known. Such polymethines are commonly further categorized as merocyanines, hemioxonols, or merostyryls.

In merocyanines the basic terminal nucleus is a heterocyclic nucleus comprised of a five or six membered heterocyclic ring containing at least one nitrogen heteroatom. To achieve significant light absorption in the visible spectrum, thereby qualifying as a dye, the heterocyclic nucleus must exhibit aromaticity. In so-called zero methine merocyanines there are two methine groups linking the nuclei, but one linking methine group lies in the basic nucleus while the second linking methine group lies in the acidic nucleus. Thus, there are no methine groups separating the nuclei. Homologues of the zero methine merocyanines are those which contain two, four, or a higher even number of methine groups joining the terminal acidic and basic nuclei.

Hemioxonals and merostyryls can be viewed as differing from merocyanines in that their basic terminal nuclei take the form of aminomethine and p-aminophenylmethine nuclei, respectively.

The acidic electron accepting terminal nucleus of each of these polymethines can be either heterocyclic or acyclic. When the acidic terminal nucleus is acyclic, it takes the form of a methylene group which is disubstitued with two strong electron withdrawing groups. The most commonly employed strong electron withdrawing groups are cyano, sulfo, and carbonyl groups, where the latter includes carboxylic acid and ester as well as acyl groups. Acrylic acidic electron accepting terminal nuclei of polymethines are illustrated by (R-1) Collins et al U.S. Pat. No. 2,411,507,
(R-2) Kendall et al U.S. Pat. No. 2,511,210,
(R-3) Kendall et al U.S. Pat. No. 2,693,472,
(R-4) Edwards et al U.S. Pat. No. 2,721,799,
(R-5) Kofron et al U.S. Pat. No. 4,439,520, and
(R-6) Gunther et al U.S. Pat. No. 4,576,905.

Polymethines with a basic electron donating terminal nucleus and an acidic terminal nucleus are known to serve a variety of uses. Such polymethines are known to be useful both as UV absorbers and dyes. These dyes and UV absorbers have been incorporated into photographic elements to serve a variety of purposes. In one application of particular interest these polymethines are incorporated in ultraviolet responsive imaging systems. Since ultraviolet light is both more energetic and capable of absorption with simpler molecular resonance structures than visible light, it is not surprising that there are a variety of known imaging materials which respond to ultraviolet, but not visible light. The sensitivity of these imaging systems can be extended to longer wavelength UV radiation and into the visible portion of the spectrum by incorporating a photosensitizer. Merocyanines have been extensively employed as photosensitizers and to a lesser extent (largely due to shorter wavelength absorption peaks) hemioxonols and merostyryls have been similarly employed.

Photographic silver halide emulsions are illustrative of imaging systems known to employ dyes from these polymethine classes as photosensitizers. The radiation sensitive silver halide grains present in photographic emulsions exhibit very limited absorption of radiation of wavelengths extending into the visible spectrum. However, with a dye absorbed to the grain surfaces, the emulsions are highly responsive to visible light. The dye absorbs exposing photons and transfers either energy or an electron to the grain. The patents cited above disclose this photographic utility for merocyanine, hemioxonol, and merostyryl dyes.

A variety of photographic imaging systems are known wherein a hardenable organic component containing ethylenic unsaturation sites is relied upon for image formation. The organic component undergoes photoinduced addition reactions, typically either polymerization or crosslinking, at the ethylenic unsaturation sites which produce hardening and allow image discrimination to be achieved.

It is common practice in preparing these compositions to employ coinitiators. One of the coinitiators is a photosensitizer. Photosensitizers are relied upon to capture photons of exposing radiation. The remaining coinitiator is referred to as an activator. The activator is not relied upon to respond directly to exposing radiation, but rather adjacent activator and photosensitizer molecules react, following excitation of the latter by photon capture, causing release by the activator of a free radical which in turn induces immobilizing addition reactions at sites of ethylenic unsaturation. The use of merocyanine dyes and UV absorbers as photosensitizers in such imaging systems is illustrated by (R-7) Specht et al U.K. No. 3,083,832A.

(R-8) *Research Disclosure*, Vol. 200, December 1980, Item 20036, while the use of a much wider variety of polymethine dyes as photosensitizers in such imaging systems are disclosed by the following four commonly assigned copending patent applications: (A) Farid et al U.S. Ser. No. 933,712, filed Nov. 21, 1986, titled DYE SENSITIZED PHOTOGRAPHIC IMAGING SYSTEM;

(B) Farid et al U.S. Ser. No. 933,658, filed Nov. 21, 1986, titled NEGATIVE WORKING PHOTORESISTS RESPONSIVE TO SHORTER VISIBLE WAVELENGTHS AND NOVEL COATED ARTICLES (C) Farid et al U.S. Ser. No. 933,660, filed Nov. 21, 1986, titled NEGATIVE WORKING PHOTORESISTS RESPONSIVE TO LONGER VISIBLE WAVELENGTHS AND NOVEL COATED ARTICLES (D) Farid et al U.S. Ser. No. 933,657, filed Nov. 21, 1986, titled ENHANCED IMAGING COMPOSITION CONTAINING AN AZINIUM ACTIVATOR The polymethines of this invention are produced by first synthesizing corresponding polymethines containing an isocyano group as a part of the acidic terminal nucleus. The synthesis of merocyanine dyes containing such as isocyano group is the subject of commonly assigned, concurrently filed patent application Ser. No. 67,843, titled NOVEL MEROCYANINE DYES AND IMAGING COMPOSITIONS.

The following illustrate known compounds containing isocyano groups:

(R-9) U. Schollkopf, "Recent Applications of α-Metalated Isocyanides in Organic Synthesis", *Angew. Chem., Int. End.*, 1977, 16, 339–422. Note particularly compounds 9, 16, 17a, 17b, 18, 19, 32, and 34.

(R-10) R. H. Hall et al, "Synthesis of C-Glycosyl Compounds. Part 1. Reaction of Ethylisocyanoacetate with 2,3,5,6-Di-O-isopropylidene-D-mannono-1,4-lactone", *J. Chem. Soc.*, Perkin Trans. 1, 1977, 743–753. Note particularly compounds 6, 7, 11, and 12.

(R-11) C. Herdeis et al, "Heterocyclic Substituted Amino Acids via α,β-Dehydroamino Acid Derivatives. Studies on Amino Acids", *Heterocycles*, 1983, 20, 2163–2167. Note particularly compounds 3a and 3b.

(R-12) C. Herdeis et al, "Platin(II)-Komplexe Von Vinylogen Aminoisocyanides", *Chem. Ber.*, 1983, 116, 3205–3211. Note particularly compounds 1a and 1c.

(R-13) Schollkopf et al, "Syntheses with α-Metalated Isocyanides, XLIV. Note on β-Dimethylamino-α-isocyanoacrylates and Their Use in Heterocyclic Chemistry", *Justus Liebigs Ann. Chem.*, 1979, 1444–6. Note particularly compound 3.

(R-14) Hoppe, "α-Metalated Isocyanides in Organic Synthesis", *Angew. Chem., Int. Ed.*, 1974, 13, 789–804. More particularly compounds 143, 145a, and 145b.

(R-15) I. Hoppe and U. Schollkopf, "Synthesis and Biological Activities of the Antibiotic B 371 and its Analogs", *Justus Liebigs Ann. Chem.*, 1984, 600–607.

Compounds containing boron also containing an isonitrile group or prepared from a compound containing an isonitrile group are illustrated by the following:

(R-16) Ugi *Isonitrile Chemistry*, Chapter 6, "The Reaction of Isonitriles with Boranes", Academic Press, 1971, New York and London.

SUMMARY OF THE INVENTION

In one aspect this invention is directed to a polymethine dye or ultraviolet absorber containing a basic electron donating terminal nucleus joined through a methine linkage to an acidic electron accepting terminal nucleus comprised of a triarylborylisocyano group.

In another aspect this invention is directed to an imaging composition comprised of an imaging material and a polymethine dye or ultraviolet absorber containing a basic electron donating terminal nucleus joined through a methine linkage to an acidic electron accepting terminal nucleus comprised of a triarylborylisocyano group.

In still another aspect this invention is directed to a photographic element comprised of a support and, coated on the support, one or more layers including at least one radiation sensitive imaging layer, at least one of the layers being comprised of a polymethine dye or ultraviolet absorber containing a basic electron donating terminal nucleus joined through a methine linkage to an acidic electron accepting terminal nucleus, characterized in that the acidic electron accepting terminal nucleus is comprised of a triarylborylisocyano group.

DESCRIPTION OF PREFERRED EMBODIMENTS

The present invention is directed to and employs polymethine dyes and ultraviolet (UV) absorbers differing from conventional polymethines containing a basic electron denoting terminal nucleus joined through a methine linkage to an acidic electron accepting terminal nucleus in that the latter nucleus is comprised of an triarylborylisocyano group. The acidic electron accepting terminal nucleus of a polymethine dye according to this invention can be represented in its extreme resonance forms by the formulae:

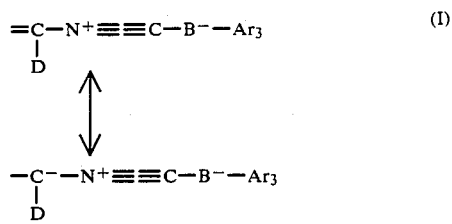

where
Ar is independently in each occurrence an aromatic group and
D is a carbonyl, cyano, or sulfo group. Since the acidic nuclei of polymethines are usually depicted by formula and discussed in terms of the resonance form in which electron displacement to the acidic terminal nucleus has not occurred (the first of the two formulae above), this established practice is followed in the subsequent discussion.

When D is a carbonyl group it can take the form of a carboxyl group, acyl group, or carboxylic ester group. It is therefore apparent that the carbonyl group can be represented by the formulae —C(O)R and —C(O)OR, where R can take the form of hydrogen, a salt forming cation (e.g., ammonium or alkali metal), or any convenient aliphatic or aromatic group. For example, R can be chosen from among alkyl and/or aryl disubstituted amino groups and alkyl, cycloalkyl, alkenyl, alkynyl, aryl, alkaryl, and aralkyl hydrocarbons. These hydrogen groups can be further substituted, if desired. Typical substituents of the hydrocarbon include oxy groups (e.g., alkoxy or aryloxy), thio groups (e.g., alkylthio or arylthio), sulfonyl groups (e.g., alkylsulfonyl or arylsulfonyl), sulfo or sulfato (including a counterion, such as hydrogen or an alkali metal ion), amine, amino, amide, amido, carbamoyl, thioamido, thiocarbamoyl, ureido, thioureido, carbonyl (e.g., carboxyl, acyl, or carboxylic ester), and halogen. The alkyl moieties can be varied widely in the number of carbon atoms contained. Alkyl, alkenyl, and alkynyl moieties of from 1 to 15 carbon atoms are specifically contemplated, with 1 to 10 carbon atoms being preferred, and 1 to 6 carbon atoms being generally optimum for use in polar solvents or hydrophilic media. Alkyl moieties of from 1 to 6 carbon atoms, hereinafter referred to as lower alkyl moieties, are most commonly employed. The aryl moieties are commonly limited to from 6 to 10 ring carbon atoms to minimize molecular bulk. Phenyl and naphthyl are the most commonly employed aryl moieties; however, there is no reason in principle that other aromatic fused ring systems cannot be employed.

When D is a cyano (nitrilomethynyl) group, it can be represented by the formula —C≡N. When D is a sulfo group, it can be represented by the formula —S(O)$_2$R, where R can take any of the forms described above.

The aromatic group Ar can take the form of any convenient aromatic ring structure. The aromatic ring structure is preferably an aromatic group containing from 6 to 10 carbon atoms. Specifically preferred are carbocyclic aromatic ring structures containing from 6 to 10 carbon atoms—e.g., phenyl, α-naphthyl, or β-naphthyl. Other carbocyclic aromatic ring structures are contemplated, such as anthracyl, phenanthracyl, and analogues having even larger numbers of fused rings, but such structures are generally less preferred, since they increase molecular bulk without correspondingly increasing radiation absorption. The aromatic ring structures can be substituted, if desired, with any of a variety of groups. For example, aromatic ring substituents can readily take any of the various substituents of aryl groups described above in connection with R. In order to append three separate aromatic substituents from a single boron atom steric compatibility must be considered in selecting substituents of the aryl groups. When the aryl groups are phenyl or β-naphthyl groups, no more than four ortho position substituents are permissible, and these should be limited in molecular bulk—e.g. alkyl of from 1 to 3 carbon atoms or less bulky substituents. When the aryl groups are α-naphthyl and larger ring structures, substituents ortho to the ring bonding position should be avoided.

In addition to the acidic electron accepting terminal nucleus the polymethines additionally include a basic electron donating terminal nucleus linked to the acidic nucleus through a carbon to carbon double bond or intervening methine groups. The basic terminal nucleus and, when present, the methine groups linking the basic and acidic terminal nuclei can take any convenient form found in conventional polymethine dyes and UV absorbers.

In one preferred form the basic nucleus takes the form a heterocyclic nucleus comprised of a five or six membered heterocyclic ring containing at least one nitrogen heteroatom. When the basic nucleus takes this form the polymethine is a merocyanine. In another preferred form the basic nucleus is an aminomethine group, and the resuling polymethine is a hemioxonol group.

Thus, the preferred polymethine dyes and UV. absorbers according to the present invention comprise those satifying the formulae:

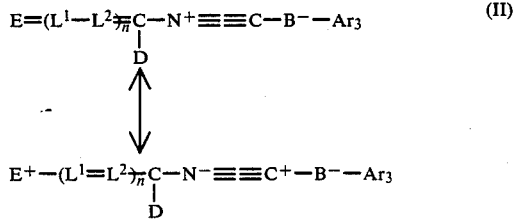

where
Ar is independently in each occurrence an aromatic nucleus containing from 6 to 10 ring carbon atoms;
D is an electron withdrawing group having a cyano, sulfo, or carbonyl group;
E is chosen from the class consisting of
  (i) a heterocyclic nucleus comprised of a five or six membered heterocyclic ring containing at least one heteroatom chosen from the class consisting of nitrogen and chalcogen and
  (ii) an aminomethine group;
L$^1$ and L$^2$ are methine groups; and
n is the integer 0, 1, or 2.

In one preferred form the heterocyclic nucleus E completes an azolinylidene or azinylidene ring. In the neutral and charged resonance forms of the merocyanine dye the basic nucleus containing the azolinylidene or azinylidene ring can be represented by the formulae:

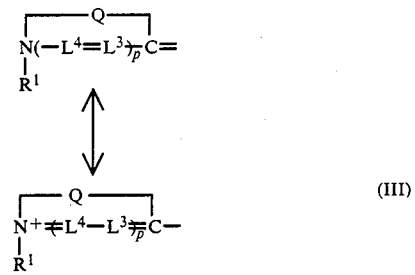

wherein
p is the integer 0 or 1;
L$^3$ and L$^4$ independently represent methine groups;
R$^1$ is a quaternizing substituent; and
Q represents the atoms completing a basic azolinylidene or azinylidene nucleus.

In specifically preferred forms Q is chosen to complete an azolinylidene or azinylidene nucleus chosen from the group consisting of 2-piperidylidene, 2-pyrrolidinylidene, 2- or 4-pyridylidene, imidazopyridylidene, 2- or 4-quinolinylidene, 1- or 3-isoquinolinylidene, benzoquinolinylidene, thiazoloquinolylidene, imidazoquinolinylidene, 3H-indolylidene, 3H-benzindolylidene, oxazolinylidene, oxazolidinylidene, benzoxazolinylidene, naphthoxazolinylidene, oxadiazolinylidene, thiazolidinylidene, phenanthrothiazolinylidene, acenaphthothiazolinylidene, thiazolinylidene, benzothiazolinylidene, naphthothiazolinylidene, tetrahydrobenzothiazolinylidene, dihydronaphthothiazolinylidene, thiadioxazolinylidene, selenazolidinylidene, selenazolinylidene, benzoselenazolinylidene, naphthoselenazolinylidene, selenadiazolinylidene, benzotellurazolinylidene, naphthotelluroazolinylidene, pyrazolylidene, imidazolinylidene, imidazolidinylidene, benzimidazolinylidene, naphthimidazolinylidene, diazolinylidene, tetrazolinylidene, and imidazoquinoxalinylidene nuclei.

The quaternizing substituent (R$^1$) is an optionally substituted hydrocarbon substituent, such as an alkyl, cycloalkyl, alkenyl, alkynyl, aryl, aralkyl, or alkaryl group. The number of carbon atoms in the hydrocarbon moieties as well as the various optional substitutents can be chosen similarly as described above in connection with R.

In addition to azolinylidene and azinylidene nuclei, heterocyclic aromatic basic electron donating terminal nuclei satisfying the requirements of E in formulae II can be chosen from a variety of nuclei known to form dyes which contain only chalogen heteroatoms. Such nuclei include pyranylidene, benzopyranylidene, dibenzopyranylidene, thiapyranylidene, benzothiapyranylidene, naphthothiapyranylidene, selenapyranylidene, tellurapyranylidene, benzotellurapyranylidene, naphthotellurapyranylidene, dithiolylidene (a.k.a. disulfolylidene), benzodithiolylidene, and naphthodithiolyidene nuclei. These nuclei are similar to the azolinylidene and azinylidene nuclei described above in that they resonate between a form in which a ring heteroatom is charged or uncharged, except that in these rings, no nitrogen atom being present, it is a chalcogen atom which assumes a positive charge. In the resonance form in which the chalcogen atom is charged each pyranylidene nuclei is usually named as the corresponding pyrylium nucleus. Dyes containing exemplary useful pyranylidene (i.e., pyrylium) nuclei containing an oxygen, sulfur, selenium, or tellurium atom are disclosed in Detty et al U.S. Pat. Nos. 4,365,017 and 4,584,258.

When the polymethines of the invention are hemioxonols, E takes the form an aminomethine nucleus, which can be represented by the following formulae:

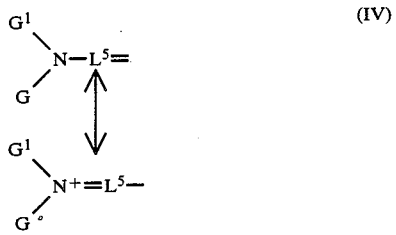

where
$L^5$ is methine group and
G and $G^1$ can independently take any of the forms of R and $R^1$ described above or can together complete a ring system derived from a cyclic secondary amine, such as pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

The methine groups in formulae II, III, and IV—i.e., $L^1$, $L^2$, $L^3$, $L^4$, and $L^5$, can be independently in each occurrence unsubstituted methine groups (i.e., —CH= groups) or substituted methine groups represented by the formula —C($R^2$)=, where $R^2$ can represent any convenient monovalent substituent— e.g., $R^2$ can take any of the various forms of R described above. Alkyl substituents of from 1 to 4 carbon atoms (e.g., methyl or ethyl) and phenyl substituents (e.g., phenyl, tolyl, or xylyl) are most commonly encountered and are preferred. It is common to incorporate a substituted methine in the methine linkage joining the terminal nuclei to promote dye aggregation. In variant form $R^2$ in two different methine groups can together take the form of an alkylene group of from 1 to 6 carbon atoms. Such alkylene groups are referred to as bridging groups and are commonly employed to rigidize the dye molecule.

When E takes the form of an aminomethine nucleus as represented by formula IV and $L^5$ takes the form —C($R^2$)=, where $R^2$ is a secondary amino group, a preferred polymethine results satisfying the following formula:

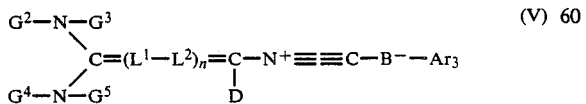

where
$G^2$ and $G^3$ independently or together can take any of the various forms of G and $G^1$, $G^4$ and $G^5$ independently or together can taken any of the various forms of G and $G^1$, or $G^2$ and $G^4$ can together complete a 5 or 6 membered ring (e.g., an alkylene group providing 2 or 3 ring carbon atoms joining the amino nitrogen atoms) and Ar, D, $L^1$, $L^2$, and n can take any of the forms identified above.

Procedures for synthesizing representative polymethines according to the inventin are included in the examples below. From these examples the synthesis of variant forms of the polymethines will be readily apparent.

Specific polymethines according to the invention are listed in Table I

TABLE I

| | |
|---|---|
| D-1 | Ethyl 4-(3-ethyl-2-benzothiazolinylidene)-2-triphenylborylisocyano-2-butenoate |
| D-2 | Ethyl 4-(3-ethyl-2-benzothiazolinylidene)-2-tri(p-fluorophenyl)borylisocyano-2-butenoate |
| D-3 | Ethyl 2-(3-ethyl-2-benzothiazolinylidene)-2-triphenylborylisocyanoacetate |
| D-4 | Ethyl 2-(3-ethyl-2-benzothiazolinylidene)-2-tri(p-fluorophenyl)borylisocyanate |
| D-5 | Ethyl 6-(3-ethyl-2-benzothiazolinylidene)-2-triphenylborylisocyano-2,4-hexadienoate |
| D-6 | Ethyl 6-(3-ethyl-2-benzothiazolinylidene)-2-tri(p-fluorophenyl)borylisocyano-2,4-hexadienoate |
| D-7 | 3-Ethyl-2-(1-triphenylborylisocyano-1-phenylsulfonyl-1-propen-3-ylidene)benzothiazoline |
| D-8 | Ethyl 4-(3-ethyl-2-benzoxazolinylidene)-2-triphenylborylisocyano-2-butenoate |
| D-9 | Ethyl 4-(3-ethyl-2-benzoxazolinylidene)-2-tri-(p-fluorophenyl)borylisocyano-2-butenoate |
| D-10 | Ethyl 6-(3-ethyl-2-benzoxazolinylidene)-2-triphenylborylisocyano-2,4-hexadienoate |
| D-11 | Ethyl 6-(3-ethyl-2-benzoxazolinylidene)-2-tri-(p-fluorophenyl)borylisocyano-2,4-hexadienoate |
| D-12 | 2-[1-Cyano-1-tri(p-fluorophenyl)borylisocyano-1-propen-3-ylidene]-3-ethylbenzoxazoline |
| D-13 | Ethyl 4-(3-ethyl-2-selenazolinylidene)-2-triphenylborylisocyano-2-butenoate |
| D-14 | Ethyl 4-(3-ethyl-2-benzoselenazolinylidene)-2-tri(p-fluorophenyl)borylisocyano-2-butenoate |
| D-15 | Methyl 2-(3-ethyl-2-benzotellurazolinylidene)-2-triphenylborylisocyanoacetate |
| D-16 | Ethyl 4-(1-ethyl-2-quinolinylidene)-2-triphenylborylisocyano-2-butenoate |
| D-17 | Ethyl 4-(1-ethyl-2-quinolinylidene)-2-tri(p-fluorophenyl)borylisocyano-2-butenoate |
| D-18 | Methyl 4-(1-methyl-2-pyridylidene)-2-tri(p-fluorophenyl)borylisocyano-2-butenoate |
| D-19 | Ethyl 4-(5,6-dichloro-1,3-diethyl-2-benzimidazolinylidene)-2-triphenylborylisocyano-2-butenoate |
| D-20 | Ethyl 4-(5,6-dichloro-1,3-diethyl-2-benzimidazolinylidene)-2-tri(p-fluorophenyl)borylisocyano-2-butenoate |
| D-21 | Ethyl 4-[3,3-dimethyl-1-ethyl-2(3H)—indolylidene]-2-triphenylborylisocyano-2-butenoate |
| D-22 | Ethyl 2-(4,5-dihydronaphtho[1,2-d]-1,3-dithiol-2-ylidene)-2-triphenylborylisocyanoacetate |
| D-23 | Ethyl 2-(4,5-dihydronaphtho[1,2-d]-1,3-dithiol-2-ylidene)-2-tri(p-fluorophenyl)borylisocyanoacetate |
| D-24 | Ethyl 4-(4,6-diphenyl-2-pyranylidene)-2-triphenylborylisocyano-2-butenoate |
| D-25 | Ethyl 4-(4,6-diphenyl-2-pyranylidene)-2-tri(p-fluorophenyl)borylisocyano-2-butenoate |
| D-26 | Ethyl 4-(2,6-di-t-butyl-4-selenapyranylidene)-2-tri(p-fluorophenyl)borylisocyano-2-butenoate |
| D-27 | Ethyl 2-(2,6-diphenyl-4-tellurapyranylidene)-2-triphenylborylisocyanoacetate |
| D-28 | Ethyl 4-(2-phenyl-4-benzothiapyranylidene)-2-tri(p-fluorophenyl)borylisocyano-2-butenoate |
| D-29 | Ethyl 4-(2,6-diphenyl-4-pyranylidene)-2-triphenylborylisocyano-2-butenoate |
| D-30 | Ethyl 4-(2,6-diphenyl-4-pyranylidene)-2-tri-(p-fluorophenyl)borylisocyano-2-butenoate |
| D-31 | Ethyl 4-(1-ethyl-4-quinolinylidene)-2-triphenylborylisocyano-2-butenoate |
| D-32 | Ethyl 4-(1-ethyl-4-quinolinylidene)-2-tri(p- |

TABLE I-continued

|      | fluorophenyl)borylisocyano-2-butenoate |
|------|----------------------------------------|
| D-33 | Ethyl 3-dimethylamino-2-triphenylborylisocyano-2-propenoate |
| D-34 | Ethyl 3-dimethylamino-2-tri(p-fluorophenyl)-borylisocyano-2-propenoate |
| D-35 | Methyl 3-dimethylamino-2-tri(p-tolyl)borylisocyano-2-propenoate |
| D-36 | Ethyl 3,3-bis(dimethylamino)-2-triphenylboryl-isocyano-2-propenoate |
| D-37 | Ethyl 3,3-bis(dimethylamino)-2-tri(p-fluorophenyl)borylisocyano-2-propenoate |
| D-38 | Methyl 5-dimethylamino-2-triphenylborylisocyano-2,4-pentadienoate |
| D-39 | Ethyl 2-(1,3-dimethyl-2-imidazolidinylidene)-2-triphenylborylisocyanoacetate |
| D-40 | Ethyl 2-(1,3-dimethyl-2-oimidazolidinylidene)-2-tri(p-fluorophenyl)borylisocyanoacetate |

The polymethine dyes and UV absorbers of this invention can serve any of the known uses for corresponding conventional polymethine dyes and UV absorbers. Polymethine dyes have found extenive use in photography. The polymethines of this invention are specifically contemplated to be used as photosensitizers in photographic imaging systems.

In one specific form a photographic imaging system according to the present invention containing a polymethine satisfying formulae II above can take the form of a silver halide photographic element. In its most widely employed form silver halide photography employes for imaging radiation sensitive silver halide grains. The grains are suspended in a dispersing medium, typically including a hydrophilic colloid, such as gelatin, so that the grains and dispersing medium together form a radiation sensitive silver halide emulsion. The silver halide emulsions are typically coated on a photographic film or paper support to form a photographic element. A simple photographic element can consist of a support and an emulsion layer; however, typically additional hydrophilic colloid layers, such as multiple emulsion layers, subbing layers, interlayers, and overcoats are also present. The silver halide emulsions can be usefully, though incompletely, categorized as those which form predominatly surface or predominantly internal latent images upon exposure. Photographic elements can be conveniently classified as being direct positive photographic elements or negative working photographic elements. Whether a positive or negative viewable image is produced is a function of both the emulsion chosen and the photographic processing undertaken. Although light processing is known and employed for specialized applications, in most instances photographic processing to produce a viewable image is accomplished by development of an imagewise exposed photographic element in an aqueous alkaline processing solution. Usually internal latent image forming emulsions are employed in combination with uniform light exposure or, preferably a nucleating agent, to produce direct positive images. Direct positive images can be produced also by employing initially surface fogged silver halide grains which rely on selective development of unexposed grains to produce direct positive images. Internal latent image emulsions can be used to produce negative images by internal development—that is, developing in the presence of iodide ion or a silver halide solvent capable of rendering the internal latent image site accessible to the developing agent. Aside from solarization effects, surface latent image emulsions cannot produce direct positive images, but are extensively used to produce positive color images by reversal processing. Of extreme importance to obtaining commercially attractive photographic images are a large variety of emulsion, photographic element, and processing solution addenda. A succinct summary of radiation sensitive silver halide emulsions, photographic elements, processing solutions, their basic and modifying components, and significant patents and publications describing their features is contained in *Research Disclosure,* Vol. 176, December 1978, Item 17643. *Research Disclosure* is published by Kenneth Mason Publications, Ltd., 8 North Street, Emsworth, Hampshire PO10 7DD, England.

The polymethines of this invention are in a preferred application incorporated into one or more hydrophilic colloid layers of silver halide photographic elements. The location and concentration the polymethine is dictated by the photograhically useful function sought to be realized. The polymethine dyes of the invention can be located behind one or more silver halide emulsion layers as imagewise exposed to absorb actinic radiation penetrating the silver halide emulsion layer or layers, thereby reducing scattered radiation. In other words, the dyes can be employed as antihalation dyes. The polymethines can be incorporated in interlayers or in overcoats to function as filter dyes and UV absorbers. When used as UV absorbers in overcoat layers the polymethines can protect dye images in the photographic elements from fading. In a preferred application the polymethines can be incorporated directly in the silver halide emulsion. They can increase photographic sharpness by intercepting and absorbing actinic radiation that would otherwise be reflected between grains. In other words, the dyes can take the form of inter-grain absorbers.

When the merocyanine dyes are employed as a photosensitizer in a photographic silver halide emulsion, they are adsorbed to the surfaces of the radiation-sensitive silver halide grains. As is generally well understood in the art, optimum photosensitization is achieved when the dye concentration is chosen to provide a monomolecular coverage of from 25 to 100 percent of the silver halide grain surface, as disclosed, for example, in West et al, "The Adsorption of Sensitizing Dyes in Photographic Emulsions", *Journal of Phys. Chem.,* Vol. 56, 1952, p. 1065; Spence et al, "Desensitization of Sensitizing Dyes", *Journal of Physical and Colloid Chemistry,* Vol. 56, No. 6, June 1948, pp. 1090-1103; and Gilman et al U.S. Pat. No. 3,979,213. Optimum dye concentration levels of photosensitization can be chosen by procedures taught by Mees, Theory of the Photographic Process, First Edition, pp. 1067-1069.

A variety of imaging systems are known which contain a composition capable of being hardened imagewise by ultraviolet exposure. By incorporating a polymethine dye according to the present invention these imaging systems can be made to respond to imagewise exposures within the near ultraviolet and/or visible spectrum. Such systems embrace negative working photoresists, which are used primarily to define image patterns of protective layers. Such systems additionally embrace dye imaging systems in which hardening controls the mobility of an image dye or dye precursor.

A typical hardenable imaging system which can be rendered responsive to radiation in the near UV or visible spectrum by incorporation of a polymethine according to this invention includes in addition to the polymethine an organic component which undergoes photoinduced addition reactions, typically either polymerization or crosslinking, at the ethylenic unsaturation sites which produce hardening and an activator.

The photosensitizer and activator together form coinitiators for hardening. The photosensitizer is relied upon for photon capture in the visible spectrum. Adjacent activator and photosensitizer molecules react, following excitation of the latter by photon capture, causing release by the activator of a free radical which in turn induces immobilizing addition reactions at sites of ethylenic unsaturation.

Since interaction of the activator and photosensitizer are required for successful visible imaging, it is apparent that the choice of the specific merocyanine dye according to the invention chosen for use as a photosensitizer is related to the specific choice of the activator.

In one specifically contemplated form of the invention the activator can take the form of an azinium salt. The azinium salt activators employed in the imaging compositions of this invention can take any convenient form and can be chosen from among known azinium salt activators. The azinium activators disclosed by Heseltine et al and Jenkins et al U.S. Pat. Nos. Re. 27,922 and Re. 27,925, Specht and Farid U.K. 3,083,832A, and *Research Disclosure*, Vol. 200, December 1980, Item 20036, cited above, provide a variety of examples of useful azinium activators.

In addition to being a polymethine as previously defined, to be useful as a photosensitizer in the present invention the polymethine must exhibit a reduction potential which is at most 0.1 volt more positive than the reduction potential of the azinium salt activator with which it is employed. Electron transfer from the photosensitizer to the activator is efficiently achieved when the reduction potential of the longer wavelength dye is more negative than that of the photoactivator. In addition, when the reduction potentials of the photosensitizer and activator are equal, energy transfer can still occur. Further, effective performance has been observed when the reduction potential of the photosensitizer is more positive than that of the activator to a limited degree.

In the overwhelming majority of instances precise determinations of reduction potentials are not required to ascertain that the proper relationship of reduction potentials of the azinium activator and the polymethine exists. In those few instances in which the reduction potential of the dye is sufficiently positive with respect to that of the activator that a precise determination of reduction potentials is desired, it must be taken into account that reduction potentials can vary as a function of the manner in which they are measured. To provide a specific standard for reduction potential determination, the procedure is employed described by J. Lenhard, "Measurement of Reversible Electrode Potentials for Cyanine Dyes by the Use of Phase-Selective Second Harmonic AC Voltammetry", Journal of Imaging Science, Vol. 30, No. 1, January/February 1986.

The remaining essential ingredient of the coinitiator containing imaging composition is an organic component containing ethylenic unsaturation sites and capable of selective hardening by addition at the sites of ethylenic unsaturation. A broad variety of vinyl monomers, vinyl oligomers, and polymers containing ethylenic unsaturation are known and useful in imaging systems according to the invention. Specific choices of hardenable organic components are illustrated by reference to certain preferred imaging systems.

In one preferred form of the invention the imaging composition can take the form of a negative working photoresist. The organic component of the negative-working photoresist to be acted upon by the coinitiators can take the form of any conventional negative-working photoresist organic film forming component containing ethylenic unsaturation and capable of selective immobilization by undergoing a hardening addition reaction at the site of the ethylenic unsaturation. Immobilization can be imparted by initiating polymerization of monomers containing ethylenic unsaturation or by initiating crosslinking of linear polymers or oligomers containing ethylenic unsaturation. For example, any of the monomeric or crosslinkable polymeric film forming components disclosed in Jenkins et al and Heseltine et al U.S. Pat. Nos. Re. 27,925 or Re. 27,922, respectively, are suitable for use in the imaging compositions of this invention and are here incorporated by reference. Tan et al U.S. Pat. No. 4,289,842, here incorporated by reference, discloses negative working hardenable imaging compositions containing light sensitive acrylate copolymers containing pendant groups, such as alkenyl group with ethylenic unsaturation. Lindley U.S. Pat. No. 4,590,147, here incorporated by reference, discloses vinyl oligomers which can be employed as film forming components in the hardenable imaging compositions of this invention. Useful film forming components containing vinyl monomers are diclosed in Fuerniss U.S. Pat. No. 4,497,889 and Anderson et al U.S. Pat. No. 4,535,052, both here incorporated by reference. Kosar *Light-Sensitive Systems*, John Wiley & Sons, 1965, further describes a variety of useful film forming components for use in the practice of this invention, including ethylenically unsaturated monomers and polymers.

Preferred film forming components are comprised of at least one addition polymerizable ethylenically unsaturated compound having a boiling point above 100° C. at normal pressure which is preferably employed in combination with a polymeric binder. The ethylenically unsaturated compound (typically a monomer) and the polymeric binder can be employed together in widely varying proportions, including ethylenically unsaturated compound ranging from 3 to 97 percent by weight of the film forming component and polymeric binder ranging from 97 to 3 percent by weight of the film forming component. A separate polymeric binder, though preferred, is not an essential part of the film forming component and is most commonly omitted when the ethenically unsaturated compound is itself a polymer.

Chang U.S. Pat. No. 3,756,827, here incorporated by reference, discloses in column 2, line 36 to column 3, line 30, a variety of suitable organic monomers for use in the hardenable imaging compositions of this invention. Specifically illustrated in the examples below are ester monomers containing ethylenic unsaturation. Similar monomers include ethylenically unsaturated diester polyhydroxy polyethers, described in Chambers U.S. Pat. No. 4,245,031, here incorporated by reference.

Organic polymeric binders which can form a part of the film forming component of the photoresist include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having weight average molecular weights from 4000 to 4,000,000; (6) polyurethanes; (7) polycarbonates; (8)

synthetic rubbers—e.g., homopolymers and copolymers of butadienes, and (9) homopolymers and copolymers formed from monomers containing ethylenic unsaturation, such as polymerized forms of any of the various the ethylenically unsaturated monomers, such as polyalkylenes—e.g. polyethylene and polypropylene; poly(vinyl alcohol); poly(vinyl esters)—e.g., poly(vinyl acetate); polystyrene; poly(acrylic and methacrylic acids and esters)—e.g., poly(methyl methacrylate) and poly(ethyl acrylate), as well as copolymer variants.

The foregoing is, of course, only an illustrative listing of the most commonly encountered hardenable components. Other specific illustrative hardenable components are included in the examples.

In addition to the hardenable component and the coinitiators the imaging compositions can contain any one or combination of known addenda, such as thermal inhibitors, colorants (including dyes and pigments), plasticizers, fillers, etc. To facilitate coating on a substrate the film forming component, coinitiators, and addenda, if any, are usually dispersed in a solvent to create a solution or slurry, the liquid being evaporatively removed after coating. Any solvent can be employed for this purpose which is inert toward the film forming components and addenda of the photoresist. Solvents can be chosen from among a wide variety of organic liquids, including N,N-dimethylformamide; N,N-dimethylacetamide; alcohols, such as methanol, ethanol, butanol, etc.; ketones, such as acetone, cyclohexanone, and butanone; esters, such as ethyl acetate and ethyl benzoate; ethers, such as tetrahydrofuran and dioxane; chlorinated aliphatic hydrocarbons, such as methylene chloride and 1,2-dishloroethane; aromatic hydrocarbons, such as benzene and toluene; and other common solvents, such as dimethyl sulfoxide, chlorobenzene, and various mixtures of solvents.

The substrate onto which the photoresist is coated can take any convenient conventional form. For example, the photoresist can be used to define a pattern during fabrication of an electronic component. In this instance the substrate can take the form of a printed circuit board or semiconductor chip, typically one which has been only partially fabricated to a completed form. In other instances hardenable imaging compositions can be coated on simple unitary substrates, such as glass, ceramic, metal, cellulose paper, fiberboard, or polymer substrates. Specific substrates include alumina-blasted aluminum, anodized aluminum, alumina-blasted poly(ethylene terephthalate) film, poly(ethylene terephthalate) film, flame or electrostatic discharge treated poly(ethylene terephthalate) film, poly(vinyl alcohol)-coated paper, crosslinked polyester-coated paper, nylon, glass, cellulsoe acetate film heavy paper, such as lithographic paper, and the like.

In perhaps their most commonly used form hardenable imaging compositions are coated in a fluid form on a substrate and evaporatively dried, usually with heating, to produce a uniform coating. Often, particularly in the manufacture of semiconductor devices, the substrate is spun, thereby employing cetrifugal forces to assure the uniformity of the photoresist coating before drying. After exposure to actinic radiation causes addition to occur at the ethylenic unsaturation sites of the film forming component, a liquid developer is brought into contact with the coated substrate to remove selectively the photoresist in areas which were not exposed to actinic radiation.

The liquid developer can be any convenient liquid which is capable of selectively removing the photoresist in unexposed areas. The coated photoresist can be sprayed, flushed, swabbed, soaked, or otherwise treated with the develope to achieve selective removal. In its simplest form the liquid developer can be the same liquid employed as a solvent in coating the photoresist. Methoxethyl acetate and ethoxyethyl acetate are common developers. Also aqueous developers are commonly employed, such as miscible combinations of water and alcohols, with proportions in the range of from 20 to 80 percent water and 80 to 20 percent alcohol being common. Exemplary water miscible alcohols include glycerol, benzyl alcohol, 1,2-propanediol, sec-butyl alcohol, and ethers derived from glycols, such as dihydroxy poly(alkylene oxides). Lactone developers, such as those disclosed by Martinson et al U.S. Pat. No. 3,707,373, can be employed. Optimum developer choices for specific hardenable imaging compositions are disclosed in the various patents cited above illustrating the specific film forming components.

In another manner of use, a photoresist layer is coated on a support and overcoated with a strippable cover sheet. The end user typically purchases the photoresist as an article rather than a liquid composition. After removing the cover sheet, the photoresist layer together with its support is laminated to the substrate on which the image pattern is desired. Following patterned exposure to actinic radiation through the support, the support is stripped from the substrate leaving photoresist on the substrate in an imagewise pattern.

In still another manner of use the photoresist is coated on a support surface modified to facilitate electroless metal deposition. Again, a strippable cover sheet is located on the photoresist coating. In this use imagewise exposure to actinic radiation occurs through the cover sheet followed by stripping. Upon stripping of the cover sheet there is selective removal of the photoresist so that remaining photoresist defines the desired pattern. Electroless metal plating can then be undertaken to convert the support into an article having a metal pattern thereon. A common application is in the formation of electrical circuits.

Any conventional ratio of activator to film forming component can be present in the hardenable imaging compositions of this invention. Activator concentrations are as a practical matter most conveniently specified in terms of moles of activator per gram of dry solids, the latter consisting of the film forming component and the minor amounts of various addenda, but excluding any liquid component introduced to facilitate coating. Typically from about $2 \times 10^{-5}$ to $25 \times 10^{-5}$, most preferably from about $5 \times 10^{-5}$ to $20 \times 10^{-5}$ mole of activator is present per gram of dry solids.

The photosensitizer can be present in any concentration capable of increasing the response of the photoresist to ultraviolet or visible light. While the photosensitizer concentration can vary widely, it is generally contemplated to employ photosensitizer in concentrations ranging from about $5 \times 10^{-7}$ to $1 \times 10^{-4}$ mole per gram of dry solids. Preferred photosensitizer concentrations are in the range of from $10^{-6}$ to $5 \times 10^{-5}$ mole per gram of dry solids, with optimum concentrations generally being in the range of from about $2 \times 10^{-6}$ to $2 \times 10^{-5}$ mole per gram of dry solids.

It is possible to employ the various photoresists described above to form either monochromic or multicolor dye images merely by incorporating an imaging dye or dye precursor in the photoresist composition. Following development of the photoresist a retained dye image is presented by the photoresist coating remaining on the substrate. The colored areas correspond to the areas of exposure. Multicolor images, such as images employed for color proofing, can be produced by superimposing three elements each comprised of a transparent support and a photoresist image, where each image is formed by a different additive or subtractive primary dye.

In the foregoing imaging systems only a single coated layer is required for imaging. However, it is recognized that the imagining systems of the invention can employ multiple layers. For example, instead of blending the imaging dye with the film forming component as described above, a separate imaging dye layer can be coated between the substrate and the photoresist layer. Upon imagewise exposure and development the photoresist is removed in exposed areas. Where the photoresist remains the underlying image dye remains in its initial immobilized condition, while in other areas the dye can be removed or decolorized by washing or any other convenient technique.

In the foregoing description of photoresists the hardenable organic component containing ethylenic unsaturation sites is a film forming component. However, in certain preferred imaging systems of the invention the hardenable organic component can be present as a discontinuous or internal phase forming microcapsules which can be in contact with a surrounding continuous phase or separated therefrom by intervening rupturable encapsulating walls. While it is possible to coat microcapsules each containing the hardenable organic component, coinitiators, and imaging dye or dye precursor to form a single color image, the present invention makes possible the formation of multicolor images employing a single layer of microcapsules coated on a support. Since the microcapsules form discrete packets of materials, it is possible to mix in the same layer microcapsules containing dye photosensitizers which absorb at differing locations in the visible spectrum and imaging dyes (or their precursors) of differing imaging hues. For example, it is contemplated to coat as a single layer on a substrate (a) microcapsules containing a yellow dye photosensitizer and a yellow or blue imaging dye or its precursor, (b) microcapsules containing a magenta dye photosensitizer and a magenta or green imaging dye or its precursor, and (c) microcapsules containing a cyan dye photosensitizer and a cyan or red imaging dye or its precursor. Except for the choice of dye photosensitizer and imaging dye the microcapsules can be otherwise identical. Thus, merely by blending three differing populations of microcapsules it is possible to obtain multicolor images with the same ease and facility as monochromic dye images are obtained. Except for hue selection of components and blending of microcapsule popluations prior to coating, monochromic and multicolor imaging according to this invention are indentical. Therefore, for simplicity the description which follows is in terms of monochromic imaging, but the description is applicable to both monochromic and multicolor imaging, except as specifically noted.

The microcapsules can be employed to produce either a retained or a transferred dye image. Further, either a preformed dye or, preferably, a dye precursor can be contained in the microcapsules.

In the retained imaging system a receiver layer is coated on a substrate and is overcoated by a layer of microcapsules. Within each coated microcapsule exposure to light which is absorbed by the dye photosensitizer results in release of a free radical by the azinium activator which in turn results in hardening of the organic component containing ethylenic unsaturation. Subsequent uniform rupture of all the coated microcapsules, as by passing the exposed element between pressure rollers, results in migration of imaging dye or its precursor from the microcapsules which were not exposed and hence were not internally hardened.

The released dye or dye precursor diffuses into the receiver layer. Where an imaging dye is contained in the microcapsules, the receiver layer can be formed of any convenient transparent dye penetrable material. For example, the dye can enter a hydrophilic colloid layer or film forming polymer layer. Preferably a mordant is present in the receiver layer to immobilize the image dye on receipt.

When the microcapsules contain a dye precursor, the dye image forming layer contains a second component capable of interacting with the dye precursor to form the image dye. One of the two components is hereinafter referred to as a chromogenic material and the other is referred to as a developer. Either or both can be viewed as a dye precursor and either can be located within the microcapsules with the other located in the dye image forming layer in monochromic imaging. However, for multicolor imaging the chromogenic materials, which differ based on the hue of the dye to be produced, are located within the microcapsules. For simplicity subsequent discussion is directed to chromogenic materials contained in the microcapsules with developer being located in the receiver layer, but the converse arrangement is possible, except as specifically noted. The receiver layer can be similar to the receiver for a preformed imaging dye, differing only by the additional inclusion of a developer.

Transferred dye image systems can be similar to the retained dye image systems described above, but differ in the location of the receiver layer. Instead of coating the receiver layer on the same support as the microcapsules, the receiver layer is coated on a separate support. In integral format arrangements the receiver layer and its support can be associated with the microcapsule layer and its support at the time of exposure as well as at the time transfer to the receiver from the microcapsules occurs. Alternatively, the receiver layer and its support need not be associated with the microcapsule layer until rupture of the microcapsules occurs. In either arrangement the receiver layer and its support can be employed alone as the image bearing element or can be retained with the microcapsule layer and its support. In the latter instance the photobleachability of the photosensitizer and the initially colorless form of the chromogenic material are particularly advantageous.

In general similar materials can be employed in forming the microcapsule systems described above as have been previously described in connection with negative-working photoresists, the principal difference being in the physical continuity of the imaging layer. However, certain materials described below have been found to be particularly well suited to use in microcapsule imaging systems and constitute preferred materials.

Preferred hardenable organic components containing ethylenic unsaturation include compounds containing at least one terminal ethylenic group per molecule and preferably two or more terminal ethylenic groups per molecule. Typically they are liquid and can also double as a carrier oil for the chromogenic material in the internal phase. Representative examples of these compounds include ethylenically unsaturated acid esters of polyhydric alcohols such as trimethylol propane triacrylate. Another preferred hardenable component can include an acrylate prepolymer derived from the partial reaction of pentaerythritrol with acrylic acid or acrylic acid esters. Such materials are available from Richardson Company, Melrose Park, Ill.—e.g., Rl-1482 and Rl-1483. Also useful are isocyanate modified acrylate, methacrylate, and itaconic acid esters of polyhydric alcohols, such as disclosed by Carlick et al U.S. Pat. Nos. 3,825,479; 3,759,809; and 3,783,151.

The chromogenic materials used in the present invention are preferably oil soluble color formers which produce a dye upon reaction with a developer in the presence of a carrier oil. Representative examples of such chromogenic materials include substantially colorless compounds including a lactone, lactam, sultone, spiropyran, ester, or amido structure. Specifically preferred chromogenic materials are triarylmethane, bisphenylmethane, xanthene, thiazine, spiropyran, and similar compounds. Also useful as chromogenic materials are organic compounds capable of complexing with heavy metals to form dyes—e.g., copper phthalocyanine. Specific additive and substractive dye forming chromogenic materials are disclosed in U.S. Pat. Nos. 3,920,510; 4,399,209; and 4,440,846, here incorporated by reference.

In addition to the hardenable organic component, the coinitiators, and the chromogenic material, the discrete phase or microcapsules can also contain a carrier oil. Preferred carrier oils are weakly polar solvents having boiling points above 170° C. and preferably in the range of from 180° C. to 300° C. Exemplary carrier oils include alkylated biphenyls (e.g., monoisopropylbiphenyl), polychorinated biphenyls, caster oil, mineral oil, deodorized kerosene, naphthenic mineral oils, dibutyl phthalate, dibutyl fumerate, brominated paraffin, and mixtures thereof. Alkylated biphenyls are preferred on the basis of low toxicity while brominated paraffins employed in combination with trimethylol propane triacrylate are particularly preferred for halftone imaging.

Carrier oils are not required. As previously noted the hardenable organic component can in many instances perform the mobility providing function of a carrier oil, particularly where the hardenable organic component is a monomer. The choice of carrier oil will depend to some extent on the chromogenic material to be transported on rupture of the microcapsule. Carrier oils are chosen on the basis of their ability to impart mobility to the chromogenic material in the absence of hardening of the organic component containing ethylenic unsaturation as well as being nonreactive with the various components of the microcapsules.

The internal phase forming the microcapsules is then comprises of the hardenable organic component, an optical carrier oil, a chromogenic material, coinitiator, and any of a variety of optional components intended to offer improvement in imaging properties, such as light scattering materials, stabilizers, and the like.

The materials forming the internal phase of the microcapsules can be present in generally similar concentration ranges as previously described in connection with photoresists. In general the hardenable organic component constitutes at least about 40 percent by weight of the internal phase and typically constitutes from about 50 to 99 percent by weight of the internal phase. The chromogenic material can be present in any concentration compatible with providing a visible dye image. In general useful concentrations range from about 0.5 to 20.0 percent by weight, based on the weight of the internal phase. A preferred range of chromogenic material for monochromic imaging is from about 2 to 7 percent by weight of the internal phase. In multicolor imaging a somewhat higher concentration of chromogenic material is preferred, since only a third of the microcapsules are available to provide a maximum image dye density of any primary hue. For example, a maximum density magenta image must be formed using only the one third of the microcapsules containing the chromogenic material which forms a magenta dye. A preferred range of chromogenic material for multicolor imaging is from about 5 to 15 percent by weight of the internal phase. Carrier oils are not required, but can be present in concentrations of up to about 50 percent by weight of the internal phase, preferably in concentrations of from about 10 to 40 percent of the internal phase. The coinitiators can be present in the same concentrations set out above for the photoresists, where the dye solids percentage bases corresponds to internal phase percentage bases for the microcapsule utility.

In preferred forms the microcapsules each include in addition to the internal phase a rupturable surrounding encapsulating wall. Encapsulation can be undertaken in any conventional manner. Oil soluble chromogenic materials have been encapsulated in hydrophilic wall forming materials, such as gelatin and gelatin derivatives (e.g., phthalated gelatin), gum arabic, polyvinyl alcohol, and carboxymethylcellulose wall forming materials, as illustrated by Green et al U.S. Pat. Nos. 2,730,456 and 2,800,457; resorcinol-formaldehyde wall formers, as illustrated by Vassiliades U.S. Pat. No. 3,914,511; isocyanate-polyol wall formers, as illustrated by Kiritani et al U.S. Pat. No. 3,796,669; urea-formaldehyde wall formers, particularly urea-resorcinol-formaldehyde wall formers, as illustrated by Foris et al U.S. Pat. Nos. 4,001,140, 4,087,376, and 4,089,802; melamine-formaldehyde resin wall formers; and hydroxypropyl cellulose wall formers, as illustrated by Shackle U.S. Pat. No. 4,025,455; all of the foregoing patents being here incorporated by reference. The wall formers must, of course, be capable of transmitting exposing radiation. Preferred wall formers are gelatin and gelatin derivatives as well as urea-resorsinol-formaldehyde wall formers. Microencapsulation can be accomplished by any convenient conventional technique, including coacervation, interfacial polymerization, polymerization of one or more monomers in oil, as well as various melting dispersing, and cooling methods.

The microcapsules normally are chosen to be of a size too small to be individually discerned by the unaided eye. The microcapsules preferably range from about 1 to 25 micrometers ($\mu$m) in diameter, more typically from about 3 to 15 $\mu$m in diameter, depending upon the sharpness of the image desired, the smoothness of the support surface, and the technique used for rupturing the microcapsules. Generally the sharpness of the dye image increases as the size of microcapsules decreases. However, smaller microcapsules are less easily coated on rough surface supports and less easily ruptured uniformly by mechanical techniques.

The microcapsules are normally coated at a density sufficient to at least cover the surface of the support. That is, based on the average diameter of the microcapsules the coating coverage is chosen to provide at least a monolayer coverage of microcapsules on the support.

Instead of forming the microcapsules with discrete walls, it is appreciated that microcapsule containing compositions suitable for coating on a substrate can be produced by forming an emulsion in which the microcapsules constitute the discontinuous or internal phase and a binder analogous to the wall formers above constitutes the continuous phase. For example, such microcapsule coatings can be formed employing hydrophilic binders, such as hardened gelatin and gelatin derivatives.

Reacting with the chromogenic material (or first dye precursor) is a developer (or second dye precursor). The developer can take the form of any material capable of reacting with the chromogenic material to produce a dye. For the preferred classes of chromogenic materials identified above illustrative developers include clay minerals, such as acid clay, and active clay attapulgite; organic acids such as tannic acid, gallic acid, and propyl gallate; acid polymers, such as phenol-formaldehyde resins; condensates of carboxylic acids containing at least one hydroxy group and formaldehyde; metal salts of aromatic carboxylic acids, such as zinc salicylate, tin salicylate, zinc 2-hydroxynaphthenoate, zinc 3,5-di-tert-butylsalicylate; oil soluble metal salts of phenol-formaldehyde novolak resins (more specifically illustrated by U.S. Pat. Nos. 3,672,935; 3,732,120; and 3,737,410), zinc carbonate, and mixtures of the above.

When the developer is coated on a substrate, as is preferred, the developer is typically dispersed in a binder. The binder is chosen to be relatively dye permeable inert material, such as poly(vinyl alcohol), gelatin or a gelatin derivative, maleic anhydride-styrene copolymer, starch, gum arabic, or a cellulose ester. In general well known film forming binders are useful. As mentioned above, a mordant can be incorporated in the binder for the developer to assist in immobilizing the dye once it is formed. A variety of mordants particularly compatible with gelatin and gelatin derivatives are disclosed by Hartman U.S. Pat. No. 4,315,978.

While the microcapsule containing imaging system has been described above in terms of employing a chromogenic material and a developer, it is appreciated that mobile imaging dyes can be substituted for the the chromogenic material, if desired. The advantage of employing chromogenic materials is that the chromogenic material need contain no chromophore to compete with the photosensitizer for photon dye capture. Further, the chromogenic material minimizes coloration of the imaging system in areas where no image dye is formed.

While the preferred microcapsule imaging systems above have been described in terms of forming a discontinuous oleophilic phase in a continuous hydrophilic phase, it is appreciated that the reverse relationship is also possible. It is specifically contemplated to form microcapsules containing dyes or chromogenic materials which are more hydrophilic and to rely on the relative hydrophobicity if not impermeability of the microcapsule walls to initially confine the dyes. Where microcapsule wall formers are present, the same relatively hydrophilic binders described above can still be employed. The important point to note is that an extremely broad range of imaging dyes and chromogenic materials are available for use. Hartman U.S. Pat. No. 4,315,978 illustrates a variety of yellow, magenta, and cyan dyes containing polar substituents to impart mobility in more hydrophilic media.

While a few diverse imaging systems which constitute preferred embodiments of the invention have been specifically described, it is apparent that still other imaging systems employing an organic component which is hardenable by addition at sites of ethylenic unsaturation can also be improved by the incorporation of coinitiators as previously described.

EXAMPLES

The invention can be better appreciated by reference to the following specific examples.

EXAMPLE 1

Preparation of Ethyl 4-(3-ethyl-2-benzothiazolinylidene)-2-triphenyl-borylisocyano-2-butenoate (D-1)

(a) Preparation of Ethyl 4-(3-ethyl-2-benzothiazolinylidene)-2-isocyano-2-butenoate (D-1a)

To a solution of potassium t-butoxide (3.05 g, 27.2 mmol) in dry, distilled tetrahydrofuran (70 mL) at $-78°$ C. under argon was added dropwise from an addition funnel a solution of ethyl isocyanoacetate (3.08 g, 27.2 mmol) in dry distilled tetrahydrofuran (30 mL). The resulting thin, brown slurry was stirred 30 min at $-78°$ C. Solid 2-(2-acetanilidovinyl)-3-ethylbenzothiazolium iodide (12.3 g, 27.2 mmol) was added in one portion, and the reaction was allowed to warm to ambient temperature and stir 16 hours. The reaction was poured onto 150 mL water and 50 mL saturated aqueous ammonium chloride, and extracted three times with ethyl acetate. The combined extracts were washed with water and saturated sodium chloride, dried over sodium sulfate, and filtered. The solvent was removed under reduced pressure.

The residue was triturated with absolute ethanol, and the resulting solid was filtered, then recrystallized from absolute ethanol to give 4.05 g (50%) D-1a as orange needles (mp 134°–135° C.).

$^1$H NMR (300 MHz, CDCl$_3$) $\delta$7.62 (1H, d, J=12.4), 7.47 (1H, d, J=7.7), 7.36 (1H, t, J=7.8), 7.16 (1H, t, J=7.6), 7.06 (1H, d, J=8.2), 5.69 (1H, d, J=12.4), 4.30 (2H, q, J=7.1), 4.06 (2H, g, J=7.1), 1.42 (3H, t, J=7.1), 1.37 (3H, t, J=7.1), IR(KBr) 2105, 1690, 1595, 1565, 1535 cm$^{-1}$. FDMS (m/e) 300 (M+).

$\lambda_{max}$CH$_2$Cl$_2$ ($\epsilon$) 443 (62,000). Anal. calc'd. for C$_{16}$H$_{16}$N$_2$O$_2$S: C, 64.0; H, 5.4; N, 9.3. Found: C, 63.9; H, 5.4; N, 9.3.

(b) Preparation of Product (D-1)

Triphenylborane (1.56 g, 6.45 mmol) was transferred to a 100 ml 2-neck flask in a glove bag under argon. Dry, distilled tetrahydrofuran (10 ml) was added, and the slurry was cooled to 0° C. under argon. A solution of ethyl 4-(3-ethyl-2-benzothiazolinylidene)-2-isocyano-2-butenoate (1.94 g, 6.45 mmol) in dry, distilled tetrahydrofuran (10 ml) was transferred to the triphenylborane slurry through a cannula. The resulting thick orange slurry was allowed to warm to ambient temperature, and was stirred 30 min. Diethyl ether (70 ml) was added, then the orange solid was collected by filtration, washed with additional ether, and dried to give 2.79 g (80%) D-1. The filtrate was evaporated to dryness and triturated with 1:1 ether:absolute ethanol. Filtration gave an additional 0.40 g (11%) of D-1 (total crude yield: 91%). The crude material was homogeneous by thin layer chromatography and 300 MHz $^1$H NMR, and was used without purification for most purposes.

A portion was recrystallized from dichloromethane/ethanol to give D-1 as an orange, flaky solid (mp 160°–161° C. (dec.)).

$^1$H NMR (300 MHz, CDCl$_3$) δ 7.81 (1H, d, J=13.0), 7.51 (1H, d, J=7.7), 7.42–7.34 (7 H, m), 7.30–7.20 9H, M), 7.16 (1H, t, J=7.2), 7.10 (1H, d, J=8.2), 5.48 (1H, d, J=13.0), 4.29 (2H, q, J=7.1), 3.63 (2H, q, J=7.1), 1.37 (3H, t, J=7.1), 1.10 (3H, t, J=7.1). IR (KBr) 1710, 1600, 1565, 1530 cm$^{-1}$. FDMS (m/e) 542 (M+), 300.

$\lambda_{max}$CH$_2$Cl$_2$ (ε) 462 (87,000). Anal. calc'd. for C$_{34}$H$_{31}$BN$_2$O$_2$S: C 75.3; H, 5.8; N, 5.2. Found: C, 75.7; H, 5.9; N, 5.2.

EXAMPLE 2

Preparation of Ethyl-4-(3-ethyl-2-benzothiazolinyldene-2-tri(p-fluorophenyl)borylisocyano-2-butenoate (D-2)

The same procedure was employed for the reaction as for Example 1 (D-1), but using the following materials: (1) tris(p-fluorophenyl)borane (1.91 g, 6.47 mmol) in tetrahydrofuran (20 mL); and (2) ethyl 4-(3-ethyl-2-benzothiazolinylidene)-2-isocyano-2-butenoate (D-1a) (1.94 g, 6.47 mmol) in tetrahydrofuran (20 mL). After the reaction had stirred 30 min at 0° C., the solvent was removed under reduced pressure and the residue was triturated with ethanol (20 mL) with slight warming. After cooling, the resulting orange-yellow solid was collected by filtration and dried (crude yield: 2.59 g). The material was recrystallized from dichloromethane/ethanol, with filtration to remove insolubles, and the product D-2 was isolated as red-orange needles (2.30 g, 60%).

In a separate experiment as small portion was recrystallized from ethanol to give an orange flaky solid (mp 164°–166° C.).

$^1$H NMR (300 MHz, CDCl$_3$) δ 7.87 (1H, d, J=13.0), 7.56 (1H, d, J=7.6), 7.44 (1H, t, J=7.7), 7.27 (7H, m), 7.17 (1H, d, J=8.2), 6.97 (6H, app t, J=8.9), 5.40 1H, d, J=13.0), 4.33 (2H, q, J=7.1), 3.72 (2H, q, J=7.1), 1.39 (3H, t, J=7.1), 1.16 (3H, t, J=7.1). IR (KBr) 1710, 1595, 1560, 1525, 1475 cm$^{-1}$. FDMS (m/e) 596 (M+), 300, 296.

$\lambda_{max}$CH$_2$Cl$_2$ (ε): 463 (86,000), 441 (52,000) (sh), 284 (11,000), 266 (17,000). Anal. calc'd. for C$_{34}$H$_{28}$BF$_3$N$_2$O$_2$S: C, 68.5; H, 4.7: N, 4.7. Found: C, 68.3; H, 4.9; N, 4.6.

EXAMPLE 3

Preparation of Ethyl 2-(3-ethyl-2-benzothiazolinylidene)-2-triphenylborylisocyanoacetate (D-3)

(a) Preparation of Ethyl 2-(3-ethyl-2-benzothiazolinylidene-2-isocyanoacetate (D-3a)

The same procedure was employed as for Example 1 (D-1a), but using 3-ethyl-2-thiophenylbenzothiazolium iodide (10.9 g, 27.2 mmol) as the alkylating agent. The reaction was worked up as in Example 1, and trituration of the crude product obtained after solvent evaporation gave 3.91 g (52%) D-3a as a light solid that was pure by NMR and TLC (20/80 ethyl acetate/cyclohexane).

A small portion was recrystallized from ethyl acetate/ethanol for analysis and melting point (168.5°–171° C.).

$^1$H NMR (300 MHz, CDCl$_3$) δ 7.54 (1H, d, J=7.8), 7.38 (1H, t, J=7.8), 7.26–7.19 (2H, m), 4.59 (2H, q, J=7.1), 4.33 (2H, q, J=7.1), 1.58 (3H, t, J=7.1), 1.37 (3H, t, J=7.1). IR (KBr) 2090, 1665, 1510 cm$^{-1}$. FDMS (m/e) 274 (M+).

$\lambda_{max}$CH$_2$Cl$_2$ (ε): 347 (39,000), 337 (32,000) (sh). Anal. calc'd for C$_{14}$H$_{14}$N$_2$O$_2$S: C, 61.3; H, 5.1; N, 10.2. Found: C, 61.7; H, 5.2; N, 10.2.

(b) Preparation of Product (D-3)

The same procedure was employed for the reaction as for Example 1 (D-1), but using the following materials: (1) triphenylboron (1.51 g, 6.23 mmol) in tetrahydrofuran (10 mL); and (2) ethyl 2-(3-ethyl-2-benzothiazolinylidene)-2-isocyano-2-acetate (D-3a) (1.7 g, 6.23 mmol) in tetrahydrofuran (10 mL). The resulting thick slurry was stirred briefly at 0° C., then allowed to warm to ambient temperature and stir for 30 min. The solvent was removed under reduced pressure and the residue was triturated with ether (70 mL). The solid was collected by filtration to give the product as an off-white flaky solid (2.79 g). The material was homogeneous by TLC and NMR.

A portion was recrystallized from dichloromethane/ethanol with a hot filtration for analysis and mp (140°–142° C.).

$^1$H NMR (300 MHz, CDCl$_3$), δ 7.62 (1H, d, J=7.8), 7.44–7.38 (7H, m), 7.33–7.15 (11H, m), 4.40 (2H, q, J=7.1), 4.01 (2H, q, J=7.1), 1.40 (3H, t, J=7.1), 0.92 (3H, t, J=7.1). IR (KBr) 1680, 1510, 1470 cm$^{-1}$. FDMS (m/e) 516 (M+), 274, 242.

$\lambda_{max}$CH$_2$Cl$_2$ (ε): 349 (46,000). Anal. calc'd. for C$_{32}$H$_{29}$BN$_2$O$_2$S: C, 74.4; H, 5.7; N, 5.4. Found: C, 74.7; H, 5.8; N, 5.4.

EXAMPLE 4

Preparation of Ethyl 2-(3-ethyl-2-benzothiazolinylidene)-2-tri(-p-fluorophenyl)borylisocyanaoacetate (D-4)

The same procedure was employed for the reaction as for Example 1 (D-1), but using the following materials: (1) tris(p-fluorophenyl)borane (1.78 g, 6.01 mmol) in tetrahydrofuran (10 mL); and (2) ethyl 2-(3-ethyl-2-benzothiazolinylidene)-2-isocyanoacetate (D-3a) (1.65 g, 6.01 mmol) in tetrahydrofuran (10 mL). The resulting dark solution was stirred at 0° C. for 30 min, and the solvent was removed under reduced pressure. The residue was triturated with ethanol and the resulting off-white solid was isolated by filtration (3.05 g, 89%). Recrystallization from a 1:1 mixture of ethyl acetate and ethanol gave the pure product as light yellow needles (1.68 g, 49%). A second crop (0.93 g) consisted of a mixture of the desired product and a rearrangement product.

In a separate experiment, recrystallization of the crude material from ethanol gave the pure product as a tan crystalline solid (mp 158°–160° C.).

$^1$H NMR (300 MHz, CDCl$_3$) δ 7.66 (1H, d, J=7.5), 7.47 (1H, t, J=7.6), 7.38–7.22 (8H, m), 6.98 (6H, t, J=8.9), 4.41 (2H, q, J=7.1), 4.08 (2H, q, J=7.1), 1.39 (3H, t, J=7.1), 1.00 (3H, t, J=7.1). IR (KBr) 1690, 1595, 1510, 1480 cm$^{-1}$. FDMS (m/e) 570 (M+), 296, 274.

$\lambda_{max}$CH$_2$Cl$_2$ ($\epsilon$): 349 (46,000). Anal. calc'd. for C$_{32}$H$_{26}$BF$_3$N$_2$O$_2$S: C, 67.4; H, 4.6; N, 4.9. Found: C, 67.0; H, 4.8; N, 4.8.

EXAMPLE 5

Preparation of Ethyl 6-(3-ethyl-2-benzothiazolinylidene)-2-triphenyl-borylisocyano-2,4-hexadienoate (D-5)

(a) Preparation of Ethyl 6-(3-ethyl-2-benzothiazolinylidene)-2-isocyano-2,4-hexadienoate (D-5a)

The same procedure was employed for the reaction as for Example 1 (D-1a), but using the following materials: (1) potassium t-butoxide (5.6 g, 50 mmol) in tetrahydrofuran (120 mL); (2) ethyl isocyanoacetate (5.65 g, 50 mmol) in tetrahydrofuran (40 mL); (3) 2-(4-acetanilido-1-butadienyl)-3-ethylbenzothiazolium iodide (23.8 g, 50 mmol). After the reaction was stirred at ambient temperature overnight, it was quenched with 1:3 saturated ammonium chloride/water and ethyl acetate (200 mL), then was filtered to remove insolubles. The organic layer was separated and the aqueous layer was extracted twice more with ethyl acetate. The combined extracts were washed with saturated sodium chloride and dried over sodium sulfate, then filtered. The solvent was removed under reduced pressure. The residue was triturated with 1:1 ethyl acetate/ether to give 2.49 g (15%) D-5a as a blue crystalline solid that was homogeneous by TLC (2:8 ethyl acetate/cyclohexane).

In a different experiment, a small portion of crude material was recrystallized from ethanol to give D-5a (black needles) for analysis and melting point (163°–165° C.).

$^1$H NMR (300 MHz, CDCl$_3$) δ 7.40 (1H, d, J=8.8), 7.39 (1H, d, J=11.2), 7.28 (1H, t, J=7.9), 7.07 (1H, t, J=7.5), 6.97 (1H, dd, J=13.5, 12.2), 6.94 (1H, d, J=7.9), 6.28 (1H, dd, J=13.5, 12.2), 5.67 (1H, d, J=11.8), 4.27 (2H, q, J=7.1), 3.92 (2H, q, J=7.1), 1.35 (6H, 2 overlapping t). IR (KBr): 2100, 1705, 1570, 1500 cm$^{-1}$. FDMS (m/e) 326 (M+).

$\lambda_{max}$CH$_2$Cl$_2$ ($\epsilon$): 508 (60,000), 318 (3,400), 281 (6,800). Anal. Calc'd. for C$_{18}$H$_{18}$N$_2$O$_2$S: C, 66.2; H, 5.6; H, 8.6. Found: C, 66.1; H, 5.6; N, 8.5.

(b) Preparation of Product (D-5)

The same procedure was employed for the reaction as for Example 1 (D-1), but using the following materials: (1) triphenylboron (0.737 g, 3.05 mmol), in tetrahydrofuran (10 mL); and (2) ethyl 6-(3-ethyl-2benzothiazolinylidene)-2-isocyano-2,4-hexadienoate (D-5a) (0.993 g, 3.05 mmol) in tetrahydrofuran (10 mL). The resulting magenta slurry was stirred 30 min at 0° C., then ethanol (40 mL) was added. The product was isolated by filtration, washed with ethanol, and dried. The resulting green solid (1.30 g 75%) was pure by NMR.

In a separate experiment, a portion was recrystallized from dichloromethane/ethanol to give a green solid for analysis and melting point (mp 147°–149° C.).

$^1$H NMR (300 MHz, CDCl$_3$) δ 7.56 (1H, d, J=12.5), 7.46 (1H, d, J=7.7), 7.39 –7.06 (19 H, m), 5.91 (1H, t, J=12.9), 5.57 (1H, d, J=12.2), 4.28 (2H, q, J=7.1), 4.01 (2H, q, J=7.2), 1.41 (3H, t, J=7.2), 1.34 (3H, t, J=7.1). IR (KBr) 1700, 1565, 1485, 1465 cm$^{-1}$. FDMS (m/e) 568 (M+), 326.

$\lambda_{max}$CH$_2$Cl$_2$ ($\epsilon$): 555 (112,000), 525 (69,000) (sh), 276 (17,000). Anal. calc'd. for C$_{36}$H$_{33}$ BN$_2$O$_2$S: C, 76.1; H, 5.9; N, 4.9. Found: C, 75.8; H, 5.8; N, 5.2.

EXAMPLE 6

Preparation of Ethyl 6-(3-ethyl-2-benzothiazolinylidene)-2-tri(p-fluorophenyl)borylisocyano-2,4-hexadioenoate (D-6)

The same procedure was employed for the reaction as for Example 1 (D-1), but using the following materials: (1) tris(p-fluorophenyl)boron (1.03 g, 3.48 mmol) in tetrahydrofuran (10 mL); and (2) ethyl 6-(3-ethyl-2-benzothiazolinylidene)-2-isocyano-2,4-hexadienoate (D-5a) (1.13 g, 3.48 mmol) in tetrahydrofuran (10 mL). The resulting magenta solution was stirred 30 min at 0° C., then the solvent was removed under-reduced pressure. The residue was triturated with ethanol, and the resulting magenta solid was isolated by filtration and dried (1.65 g, 76%). The material was pure by NMR, and was used without further purification.

In a separate experiment, a portion was recrystallized from dichloromethane/ethanol to give a magenta solid (mp 146.5°–147° C.).

$^1$H NMR (300 MHz, CDCl$_3$) δ 7.56 (1H, d, J=12.6), 7.48 (1H, d, J=7.8), 7.38 (1H, t, J=7.7), 7.28 (6H, t, J=6.5), 7.22–7.10 (3H, m), 6.96 (6H, t, J=8.9), 5.70 (1H, br t, J=12.6), 5.52 (1H, d, J=12.2), 4.29 (2H, q, J=7.1), 4.04 (2H, q, J=7.1), 1.42 (3H, t, J=7.1), 1.34 (3H, t, J=7.1). IR (KBr) 1705, 1590, 1570, 1485, 1464 cm$^{-1}$. FDMS (m/e) 622 (M+), 326.

$\lambda_{max}$CH$_2$Cl$_2$ ($\epsilon$): 556 (118,000), 527 (66,000) (sh). Anal. calc'd. for C$_{36}$H$_{30}$BF$_3$N$_2$O$_2$S: C, 69.5; H, 4.9; N, 4.5. Found: C, 69,2; H, 5.1; N, 4.5.

EXAMPLE 7

Preparation of Ethyl 4-(3-ethyl-2-benzoxazolinylidene)-2-triphenyl-borylisocyano-2-butenoate (D-8)

(a) Preparation of Ethyl 4-(3-ethyl-2-benzoxazolinylidene)-2-isocyano-2-butenoate (D-8a)

The same procedure was employed for the reaction and work-up as for Example 1 (D-1a), but using the following materials: (1) potassium t-butoxide (2.8 g, 25 mmol); (2) ethyl isocyanoacetate (2.83 g, 25 mmol); and (3) 2-(2-acetanilidovinyl)-3-ethylbenzoxazolium iodide (10.9 g, 25 mmol). Trituration of the residue obtained after solvent evaporation with 2:1 ethanol/ether gave 3.33 g (47%) D-8a as a powdery yellow solid that was homogeneous by TLC (3:7 ethyl acetate/cyclohexane).

A portion of the material was recrystallized from ethanol to give yellow needles that were used for analysis and melting point (135°–136.5° C.).

$^1$H NMR (300 MHz, CDCl$_3$) δ 7.98 (1H, d, J=12.4), 7.29–7.20 (2H, overlapping d, t), 7.13 (1H, t, J=7.7), 7.00 (1H, d, J=7.6), 5.05 (1H, d, J=12.5), 4.27 (2H, q, J=7.1), 3.90 (2H, q, J=7.2), 1.40 (3H, t, J=7.2), 1.34 (3H, t, J=7.1). IR (KBr) 2125, 1685, 1640, 1610, 1570, 1480 cm$^{-1}$. FDMS (m/e) 284 (M+).

$\lambda_{max}$CH$_2$Cl$_2$ ($\epsilon$): 408 (72,000). Anal. calc'd. for C$_{16}$H$_{16}$N$_2$O$_3$: C, 67.6; H, 5.7; N, 9.9. Found: C, 67.6; H, 5.8; N, 9.8.

(b) Preparation of product (D-8)

The same procedure was employed for the reaction as for Example 1 (D-1), but using the following materials: (1) triphenylborane (1.15 g, 4.75 mmol) in tetrahydrofuran (15 mL); and (2) ethyl 4-(3-ethyl-2-benzoxazolinylidene)-2-isocyano-2-butenoate (D-8a) (1.35 g, 4.75 mmol) in tetrahydrofuran (15 mL). After the reaction had stirred 30 min at 0° C., the solvent was removed under reduced pressure and the residue was triturated with ethanol. The resulting yellow solid was isolated by filtration and dried (crude yield 2.01 g, 80%). Recrystallization from dichloromethane/ethanol (hot filtration) gave pure D-8 (1.64 g, 66%) as a yellow flaky solid (mp 151°-151.5° C.).

$^1$H NMR (300 MHz, CDCl$_3$) δ 8.19 (1H, d, J=13.0), 7.39-7.34 (7H; 6H, d, J=7.2; 1H, m), 7.31-7.23 (8H; 6H, t, J=7.2; 2H, m), 7.16 (3H, t, J=7.0), 7.05 (1H, d, J=7.6), 4.86 (1H, d, J=13.0), 4.31 (2H, q, J=7.1), 3.55 (2H, q, J=7.2), 1.38 (3H, t, J=7.1), 1.19 (3H, t, J=7.2), IR (KBr) 2230(w), 1700, 1633, 1587, 1555, 1480 cm$^{-1}$. FDMS (m/e) 526 (M+) 284.

$\lambda_{max}$CH$_2$Cl$_2$ (ε): 424 (87,000), 410 (63,000) (sh). Anal. calc'd. for C$_{34}$H$_{31}$BN$_2$O$_3$: C, 77.6; H, 5.9; N, 5.3. Found: C, 77.5; H, 5.9; N, 5.3.

EXAMPLE 8

Preparation of Ethyl 4-(3-ethyl-2-benzoxazolinylidene)-2-tri(p-fluorophenyl)borylisocyano-2-butenoate (D-9)

The same procedure was employed for the reaction as for Example 1 (D-1), but using the following materials: (1) tris(p-fluorophenyl)borane (0.919 g, 3.10 mmol) in tetrahydrofuran (10 mL); and (2) ethyl-4-(3-ethyl-2-benzoxazolinylidene)-2-isocyano-2-butenoate (D-8a) (0.882 g, 3.10 mmol) in tetrahydrofuran (10 mL). After the reaction had stirred 30 min at 0° C., the solvent was removed under reduced pressure and the residue was triturated with ethanol. The resulting yellow solid was filtered and dried (crude yield: 1.35 g, 75%). Recrystallization from dichloromethane/ethanol (hot filtration) gave pure D-9 (1.18 g, 66%) as yellow plates (mp 156.5°-158° C.).

A second crop (0.13 g, 7%) that was pure by NMR was also isolated (total yield: 1.31 g, 73%).

$^1$H NMR (300 MHz, CDCl$_3$) δ 8.18 (1H, d, J=13.0), 7.36 (1H, d, J=8.0), 7.33-7.21 (8H; 6H, dd, J=6.3, 8.1; 2H, m), 7.08 (1H, d, J=7.7), 6.94 (6H, t, J=8.8), 4.73 (1H, d, J=13.0), 4.31 (2H, q, J=7.1), 3.59 (2H, q, J=7.2), 1.37 (3H, t, J=7.1), 1.21 (3H, t, J=7.2). IR (KBr) 2230(w), 1700, 1635, 1587, 1560, 1495, 1480 cm$^{-1}$. FDMS (m/e) 580 (M+).

$\lambda_{max}$CH$_2$Cl$_2$ (ε): 425 (91,000), 413 (70,000) (sh). Anal. calc'd. for C$_{34}$H$_{28}$BF$_3$N$_2$O$_2$: C, 70.4; H, 4.9; N, 4.8. Found: C, 70.1; H, 4.8; N, 4.7.

EXAMPLE 9

Preparation of Ethyl 6-(3-ethyl-2-benzoxazolinylidene)-2-triphenylborylisocyano-2,4-hexadienoate (D-10)

(a) Preparation of Ethyl 6-(3-ethyl-2-benzoxazolinylidene-2-isocyano-2,4-hexadienoate (D-10a)

The same procedure was employed for the reaction as for Example 1 (D-1a), but using the following materials: (1) potassium t-butoxide (5.6 g, 50 mmol) in tetrahydrofuran (120 mL); (2) ethyl isocyanoacetate (5.65 g, 50 mmol) in tetrahydrofuran (40 mL); (3) 2-(4-acetanilido-1-butadienyl)-3-ethylbenzoxazolium iodide (23.0 g, 50 mmol). Trituration of the residue obtained after solvent evaporation with ethanol gave 2.02 g (13%) D-10a as a blue crystalline solid that was homogeneous by TLC (3:7 ethyl acetate/cyclohexane).

In a different experiment, a small portion of the crude material was recrystallized from ethanol for analysis and melting point (154.5°-155.5° C.).

$^1$H NMR (300 MHz, CDCl$_3$) δ 7.45-7.37 (2H, overlapping d, t), 7.22-7.15 (2H, overlapping d, t), 7.06 (1H, t, J=7.7), 6.91 (1H, t, J=7.7), 6.26 (1H, dd, J=12.5, 13.6), 5.02 (1H, d, J=11.9), 4.26 (2H, q, J=7.1), 3.81 (2H, q, J=7.2), 1.37 (3H, t, J=7.2), 1.33 (3H, t, J=7.1). IR (KBr) 2125, 1685, 1640, 1610, 1570, 1480. FDMS (m/e) 310 (M+).

$\lambda_{max}$CH$_2$Cl$_2$ (ε): 490 (71,000). Anal. calc'd. for C$_{18}$H$_{18}$N$_2$O$_3$: C, 69.7; H, 5.8; N, 9.0. Found: C, 69.5; H, 5.6; N, 8.9.

(b) Preparation of Product (D-10)

The same procedure was employed for the reaction as for Example 1 (D-1), but using the following materials: (1) triphenylboron (0.919 g, 3.80 mmol) in tetrahydrofuran (15 mL); and (2) ethyl 6-(3-ethyl-2-benzoxazolinylidene)-2-isocyano-2,4-hexadienoate (D-10a) (1.18 g, 3.80 mmol) in tetrahydrofuran (10 mL). After the resulting red slurry had stirred 30 min at 0° C., the solvent was removed under reduced pressure and the residue was triturated with ethanol. The resulting red solid was filtered and dried (crude yield: 1.67 g, 80%). Recrystallization from dichloromethane/ethanol (hot filtration) gave pure D-10 (1.29 g, 61%) as a red solid.

A second crop was obtained (0.18 g, 9%) that was also pure by NMR (total yield: 1.47 g, 70%). A small portion was recrystallized from acetonitrile to give tiny red needles (mp 145°-148° C., dec.).

$^1$H NMR (300 MHz, CDCl$_3$) δ 7.60 (2H, m), 7.40 (6H, d, J=7.4), 7.27 (8H: 6H, t, J=7.2; 2H, m), 7.18 (4H, m), 7.04 (1H, d, J=7.7), 5.91 (1H, t, J=12.1), 4.90 (1H, d, J=12.3), 4.29 (2H, q, J=7.1), 3.91 (2H, q, J=7.2), 1.46 (3H, t, J=7.2), 1.35 (3H, t, J=7.1). IR (KBr) 2220(w), 1700, 1640, 1620, 1570, 1565, 1500 cm$^{-1}$. FDMS (m/e) 552 (M+) 310.

$\lambda_{max}$CH$_2$Cl$_2$ (ε): 520 (102,000), 499 (68,000) (sh). Anal. calc'd. for C$_{36}$H$_{33}$BN$_2$O$_3$: C, 78.3; H, 6.0; N, 5.1. Found: C, 78.1; H, 6.1; N, 5.0.

EXAMPLE 10

Preparation of Ethyl 6-(3-ethyl-2-benzoxazolinylidene)-2-tri(p-fluorophenyl)borylisocyano-2,4-hexadienoate (D-11)

The same procedure was employed for the reaction as for Example 1 (D-1), but using the following materials: (1) tris(p-fluorophenyl)boron (1.16 g, 3.92 mmol) in tetrahydrofuran (15 mL); and (2) ethyl 6-(3-ethyl-2-benzoxazolinylidene)-2-isocyano-2,4-hexadienoate (D-10a) (1.21 g, 3.92 mmol) in tetrahydrofuran (10 mL). The reaction was stirred 30 min at 0° C., then the solvent was removed under reduced pressure. The residue was triturated with ethanol, and the resulting red solid was isolated by filtration and dried.

The crude material (1.75 g, slightly impure by NMR) was recrystallized from dichloromethane/ethanol (hot filtration) to give pure D-11 (1.55 g, 65%) as a red-brown crystalline solid (mp 167.5°-169° C., dec).

$^1$H NMR (300 MHz, CDCl$_3$) δ 7.58 (2H, m), 7.41-7.13 (9H; 6H, dd, J=6.4, 8.1; 3H, m), 7.07 (1H, d, J=7.8), 6.97 (6H, t, J=8.9), 5.64 (1H, t, J=12.1), 4.93 (1H, d, J=12.3), 4.30 (2H, q, J=7.1), 3.94 (2H, q, J=7.2), 1.45 (3H, t, J=7.2), 1.35 (3H, t, J=7.1). IR (KBr) 2230(w), 1700, 1640, 1620, 1585, 1570, 1495 cm$^{-1}$. FDMS (m/e) 606 (M+), 310.

$\lambda_{max}$CH$_2$Cl$_2$ ($\epsilon$): 521 (101,000), 497 (61,000) (sh). Anal. calc'd. for C$_{36}$H$_{30}$BF$_3$N$_2$O$_3$: C, 71.3; H, 5.0; N, 4.6. Found: C, 70.9; H, 5.1; N, 4.5.

EXAMPLE 11

Preparation of Ethyl 4-(1-ethyl-2-quinolinylidene)-2-triphenylborylisocyano-2-butenoate (D-16)

(a) Preparation of Ethyl 4-(1-ethyl-2-quinolinylidene)-2-isocyano-2-butenoate (D-16a)

The same procedure was employed for the reaction as for Example 1 (D-1a), but using the following materials: (1) potassium t-butoxide (3.36 g, 30 mmol) in tetrahydrofuran (90 mL); (2) ethyl isocyanoacetate (3.39 g, 30 mmol) in tetrahydrofuran (30 mL); (3) 2-(2-acetanilidovinyl)-1-ethylquinolinium iodide (13.3 g, 30 mmol). Trituration of the residue obtained after solvent evaporation with ethanol gave 5.18 g (59%) D-16a as an orange solid.

Recrystallization from ethanol (hot filtration) gave 4.42 g (50%) pure D-16a as an orange crystalline solid (mp 137.5°-139° C.).

$^1$H NMR (300 MHz, CDCl$_3$) δ 7.93 (1H, d, J=12.7), 7.54 (1H, dt, J=1.1, 8.0), 7.45 (1H, dd, J=1.0, 7.7), 7.39-7.28 (3H, m), 7.21 (1H, t, J=7.4), 5.63 (1H, d, J=12.8), 4.31 (2H, q, J=7.1), 4.19 (2H, q, J=7.1), 1.50 (3H, t, J=7.2), 1.38 (3H, t, J=7.1). IR (KBr) 2100, 1685, 1630, 1555 cm$^{-1}$. FDMS (m/e) 294 (M+).

$\lambda_{max}$CH$_2$Cl$_2$ ($\epsilon$): 506 (25,000) (sh), 480 (42,000), 455 (39,000) (sh), 387 (19,000). Anal. calc'd. for C$_{18}$H$_{18}$N$_2$O$_2$: C, 73.4; H, 6.2; N, 9.5. Found: C, 73.7; H, 6.3; N, 9.5.

(b) Preparation of Product (D-16)

The same procedure was employed for the reaction as for Example 1 (D-1), but using the following materials: (1) triphenylborane (1.51 g, 6.24 mmol) in tetrahydrofuran (20 mL); and (2) ethyl 4-(1-ethyl-2-quinolinylidene-2-isocyano-2-butenoate (D-16a) (1.83 g, 6.24 mmol) in tetrahydrofuran (20 mL). After the reaction slurry had stirred 30 min at 0° C., ethanol (40 mL) was added and the precipitated product was isolated by filtration, washed with ethanol, and dried to give an orange solid (2.79 g, 84%). It was pure by TLC and NMR, and was used without further purification.

A portion was recrystallized from dichloromethane/ethanol (hot filtration) to give an orange flaky solid (mp 174°-175° C.).

$^1$H NMR (300 MHz, CDCl$_3$) δ 8.12 (1H, t, J=8.4), 7.60 (1H, t, J=8.4), 7.55 (1H, d, J=7.8), 7.49 (2H, app s), 7.38 (7H: 6H, d, J=7.3; 1H, obscured), 7.34-7.24 (8H; 6H, t, J=6.9; 2H, obscured), 7.18 (3H, t, J=7.0), 5.53 (1H, d, J=13.3), 4.31 (2H, q, J=7.1), 3.82 (2H, br s), 1.41 (3H, t, J=7.1), 1.02 (3H, t, J=7.1). IR (KBr) 2220, 1690, 1622, 1540, 1490 cm$^{-1}$. FDMS (m/e) 536 (M+), 294, 242.

$\lambda_{max}$CH$_2$Cl$_2$ ($\epsilon$): 509 (47,000), 480 (57,000), 456 (39,000) (sh), 432 (33,000) (sh). Anal. calc'd. for C$_{36}$H$_{33}$BN$_2$O$_2$: C, 80.6; H, 6.2; N, 5.2. Found: C, 80.2; H, 6.2; N, 5.2.

EXAMPLE 12

Preparation of Ethyl 4-(1-ethyl-2-quinolinylidene)-2-tri(p-fluorophenyl)-borylisocyano-2-butenoate (D-17)

The same procedure was employed for the reaction as for Example 1 (D-1), but using the following materials: (1) tris(p-fluorophenyl)borane (1.83 g, 6.18 mmol) in tetrahydrofuran (20 mL); and (2) ethyl 4-(1-ethyl-2-quinolinylidene)-2-isocyano-2-butenoate (D-16a) (1.82 g, 6.18 mmol) in tetrahydrofuran (20 mL). After the reaction slurry had stirred 30 min at 0° C., the solvent was removed under reduced pressure. The residue was triturated with ethanol and the resulting product was isolated by filtration, washed with ethanol, and dried to give an orange solid (3.01 g, 82%). It was pure by TLC and NMR, and was used without further purification.

A portion was recrystallized from dichloromethane/ethanol (hot filtration) to give an orange flaky solid (mp 175°-176° C., dec).

$^1$H NMR (300 MHz, CDCl$_3$) δ 8.13 (1H, d, J=13.4), 7.64 (1H, t, J=7.9), 7.58 (1H, d, J=7.2), 7.52 (2H, m), 7.42 (1H, d, J=8.4), 7.35 (1H, t, J=7.5), 7.28 (6H, dd, J=6.4, 8.0), 6.96 (6H, d, J=8.8), 5.46 (1H, d, J=13.4), 4.32 (2H, q, J=7.1), 3.90 (2H, br s), 1.40 (3H, t, J=7.1), 1.07 (3H, t, J=7.1). IR (KBr) 2220, 1695, 1623, 1587, 1540, 1495 cm$^{-1}$. FDMS (m/e) 590 (M+) 296, 294.

$\lambda_{max}$CH$_2$Cl$_2$ ($\epsilon$): 507 (48,000), 479 (55,000), 458 (34,000) (sh). Anal. calc'd. for C$_{36}$H$_{30}$BF$_3$N$_2$O$_2$: C, 73.2; H, 5.4; N, 4.7. Found: C, 73.2; H, 5.4; N, 4.7.

EXAMPLE 13

Ethyl 4-(5,6-dichloro-1,3-diethyl-2-benzimidazolinylidene)-2-triphenylborylisocyano-2-butenoate (D-19)

(a) Preparation of Ethyl 4-(5,6-dichloro-1,3-diethyl-2-benzimidazolinylidene)-2-isocyano-2-butenoate (D-19a)

The same procedure was employed for the reaction as for Example 1 (D-1a), but using the following materials: (1) potassium t-butoxide (1.93 g, 17.2 mmol) in tetrahydrofuran (60 mL); (2) ethyl isocyanoacetate (1.94 g, 17.2 mmol) in tetrahydrofuran (20 mL); (3) 2-(2-acetanilidovinyl)-5,6-dichloro-1,3-diethylbenzimidazolium iodide (9.11 g, 17.2 mmol). After the reaction had stirred overnight at ambient temperature, the resulting slurry was poured into a 500 mL Erlenmeyer® flask with water (90 mL), saturated ammonium chloride (10 mL), and ethyl acetate (100 mL). After stirring, the orange solid was filtered and washed with water then ethyl acetate. It was then dried at ambient temperature under vacuum to give 4.43 g (68%) D-19a that was contaminated with a trace amount of the benzimidazolium starting material by TLC (3:7 ethyl acetate/cyclohexane) and NMR. Due to difficulties encountered previously in purification of the material, it was used without purification.

In a different experiment, a small portion of the crude material was recrystallized from acetonitrile for full characterization (mp 245°-250° C.).

$^1$H NMR (300 MHz, CDCl$_3$) δ 7.82 (1H, d, J=13.8), 7.17 (2H, s), 5.05 (1H, d, J=13.8), 4.22 (2H, q, J=7.1), 4.07 (4H, q, J=7.2), 1.48 (6H, t, J=7.2), 1.33 (3H, t, J=7.1). IR (KBr): 2100, 1685, 1570, 1500 cm$^{-1}$. FDMS (m/e) 379 (M+).

$\lambda_{max}$CH$_2$Cl$_2$ ($\epsilon$): 440 (112,000), 422 (61,000) (sh). Anal. calc'd. for C$_{18}$H$_{19}$Cl$_2$N$_3$O$_2$: C, 56.9; H, 5.0; N, 11.1. Found: C, 56.5; H, 5.1; N, 10.8.

(b) Preparation of D-19

The same procedure was employed for the reaction as for Example 1 (D-1), but using the following materials: (1) triphenylborane (1.23 g, 5.09 mmol) in tetrahydrofuran (15 mL); and (2) ethyl 4-(5,6-dichloro-1,3-diethyl-2-benzimidazolinylidene)-2-isocyano-2-butenoate (D-19a) (1.93 g, 5.09 mmol) in tetrahydrofuran (15 mL). After the reaction slurry had stirred 30 min at 0° C., the solvent was removed under reduced pressure. The residue was triturated with ethanol and the resulting product was isolated by filtration, washed with ethanol, and dried to give a yellow solid (2.46 g). By NMR, the crude product was contaminated with unreacted D-19a, probably due to poor quality triphenylborane. The crude product was slurried in tetrahydrofuran (30 mL), and the slurry was cooled to 0° C. Additional triphenylborane (0.285 g, 1.18 mmol) (weighed out in a glove bag as before) in tetrahydrofuran (5 mL) was added, and the reaction run and worked up as above to give the crude product (2.62 g) as a yellow solid, uncontaminated by unreacted starting material.

Recrystallization from dichloromethane/ethanol (without heating, room temperature filtration) gave, in two crops, pure D-19 (total yield: 2.12 g, 67%) as a yellow flaky solid (mp 178°–180° C.).

$^1$H NMR (300 MHz, CDCl$_3$) $\delta$ 7.90 (1H, d, J=14.4), 7.36 (6H, d, J=7.1), 7.26–7.12 (11H, m), 4.94 (1H, d, J=14.5), 4.27 (2H, q, J=7.1), 3.84 (4H, q, J=7.1), 1.38 (3H, t, J=7.1), 1.31 (6H, t, J=7.1). IR (KBr) 1705, 1695, 1555, 1490, 1450 cm$^{-1}$. FDMS (m/e) 621 (M+) 379.

$\lambda_{max}$CH$_2$Cl$_2$ ($\epsilon$): 446 (116,000), 429 (64,000) (sh). Anal. calc'd. for C$_{36}$H$_{34}$BCl$_2$N$_3$O$_2$: C, 69.5; H, 5.5; N, 6.8. Found: C, 69.6; H, 5.6; N, 6.9.

EXAMPLE 14

Ethyl 4-(5,6-dichloro-1,3-diethyl-2-benzimidazolinylidene)-2-tri(p-fluorophenyl)borylisocyano-2-butenoate (D-20)

The same procedure was employed for the reaction as for Example 1 (D-1), but using the following materials: (1) tris(p-fluorophenyl)borane (1.12 g, 3.80 mmol) in tetrahydrofuran (15 mL); and (2) ethyl 4-(5,6-dichloro-1,3-diethyl-2-benzimidazolinylidene)-2-isocyano-2-butenoate (D-19a) (1.44 g, 3.80 mmol) in tetrahydrofuran (15 mL). After the reaction slurry had stirred 30 min at 0° C., the solvent was removed under reduced pressure. The residue was triturated with ethanol and the resulting product was isolated by filtration, washed with ethanol, and dried to give a yellow solid (2.25 g).

Recrystallization from dichloromethane/ethanol (without heating, room temperature filtration) gave, in two crops, pure D-20 (total yield: 1.97 g, 77%) as a yellow crystalline solid (mp 144°–148° C.).

$^1$H NMR (300 MHz, CDCl$_3$) $\delta$ 7.89 (1H, d, J=14.4), 7.28–7.23 (8H, m), 6.93 (6H, t, J=9.0), 4.85 (1H, d, J=14.5), 4.27 (2H, q, J=7.1), 3.89 (4H, q, J=7.2), 1.36 (3H, t, J=7.2), 1.33 (6H, t, J=7.2). IR (KBr) 1695, 1595, 1560, 1510, 1450 cm$^{-1}$. FDMS (m/e) 675 (M+) 379.

$\lambda_{max}$CH$_2$Cl$_2$ ($\epsilon$): 445 (102,000), 426 (54,000) (sh). Anal. calc'd. for C$_{36}$H$_{31}$BCl$_2$F$_3$N$_3$O$_2$: C, 63.9; H, 4.6; N, 6.2; Cl, 10.3. Found: C, 63.8; H, 4.6; N, 6.1; Cl, 10.3.

EXAMPLE 15

Ethyl 2-(4,5-dihydronaphtho[1,2-d]-1,3-dithiol-2-ylidene)-2-triphenylborylisocyanoacetate (D-22)

(a) Preparation of Ethyl 2-(4,5-dihydronaphtho[1,2-d]-1,3-dithiol-2-ylidene)-2-isocyanoacetate (D-22a)

The same procedure was employed for the reaction as for Example 1 (D-1a), but using the following materials: (1) potassium t-butoxide (5.6 g, 50 mmol) in tetrahydrofuran (120 mL); (2) ethyl isocyanoacetate (5.65 g, 50 mmol) in tetrahydrofuran (40 mL); (3) 4,5-dihydronaphtho-2-(2-thiopropyl)[1,2-d]-1,3-dithiolium hexafluorophosphate (21.2 g, 50 mmol). After the reaction was stirred overnight at ambient temperature, water (90 mL), saturated ammonium chloride (10 mL), and ethyl acetate (150 mL) were added. The undissolved material was filtered, then slurried in 1:1 ethanol/ether, filtered again and dried to give (1) (3.5 g). The original filtrate was transferred to a separatory funnel and extracted three times with ethyl acetate. The combined extracts were washed with saturated sodium chloride, dried over sodium sulfate, and filtered, and the solvent was removed under reduced pressure. The residue was triturated with 1:1 ethanol/water, and the tan solid was filtered to give (2) (2.7 g). By NMR, (1) and (2) appeared to be double bond isomers of the desired product, each contaminated by a small amount of the other. (1) was recrystallized from dichloromethane/ethanol to give pure material D-22a(1) (2.25 g) (2) was flash chromatographed with 15:85 ethyl acetate/cyclohexane to give after trituration with 1:1 ethanol/ether pure D-22a(2) (0.28 g). A second group of fractions gave after evaporation and trituration as above 0.96 g D-22a(2) contaminated with a small amount of D-22a(1). The remaining fractions contained mixtures and were combined with the mother and wash liquors from the crystallization of D-22a(1) and the trituration of chromatographed material, and the solvent was removed under reduced pressure to give a tan solid (1.06 g) that was a mixture of D-22a(1) and D-22a(2) by NMR and TLC (20:80 ethyl acetate/cyclohexane). The total yield was 4.55 g (29%). D-22a(1) and D-22a(2) were fully characterized separately, although the double bond geometries could not be assigned.

D-22a(1) mp 184.5°–188° C., dec. (dichloromethane/ethanol).

$^1$H NMR (300 MHz, CDCl$_3$) $\delta$ 7.30–7.25 (3H, m), 7.17 (1H, m), 4.34 (2H, q, J=7.1), 3.07 (2H, t, J=7.9), 2.79 (2H, t, J=7.9), 1.39 (3H, t, J=7.1). IR (KBr): 2085, 1680, cm$^{-1}$. FDMS (m/e) 315 (M+).

$\lambda_{max}$CH$_2$Cl$_2$ ($\epsilon$): 391 (25,000) 377, (21,000). Anal. calc'd. for C$_{16}$H$_{13}$NO$_2$S$_2$: C, 60.9; H, 4.2; N, 4.4. Found: C, 60.8; H, 4.3; N, 4.4.

D-22a(2) mp 175°–177° C., dec. (dichloromethane/ethanol).

$^1$H NMR (300 MHz, CDCl$_3$) $\delta$ 7.27 (4H, m), 4.36 (2H, q, J=7.1), 3.08 (2H, t, J=7.9), 2.81 (2H, t, J=7.9), 1.41 (3H, t, J=7.1). IR (KBr): 2100, 1670 cm$^{-1}$. FDMS (m/e) 315 (M+).

$\lambda_{max}$CH$_2$Cl$_2$ ($\epsilon$): 390 (25,000), 377 (21,000). Anal. calc'd. for C$_{16}$H$_{13}$NO$_2$S$_2$: C, 60.9; H, 4.2; N, 4.4. Found: C, 60.6; H, 4.2; N, 4.3.

(b) Preparation of D-22

The same procedure was employed for the reaction as for Example 1 (D-1), but using the following materials: (1) triphenylborane (0.330 g, 1.36 mmol) in tetrahydrofuran (5 mL); and (2) ethyl 2-(4,5-dihydronaphtho[1,2-d]-1,3-dithiol-2-ylidene-2-isocyanoacetate (D-22a) (0.430 g, 1.36 mmol, mixture of olefin isomers) in tetrahydrofuran (5 mL). After the reaction slurry had stirred 30 min at 0° C., the solvent was removed under reduced pressure. The residue was dissolved in warm dichloromethane, filtered, and precipitated with ethanol to give pure D-15 (mixture of olefin isomers) (0.636 g, 84%) as a yellow solid (mp 119°–121° C., dec).

A small portion was recrystallized a second time for analysis.

$^1$H NMR (300 MHz, CDCl$_3$) δ 7.45–7.19 (19H, m), 4.38 (2H, q, J=7.1), 3.09 (2H, t, J=7.9), 2.82 (2H, t, J=7.9), 1.41 (3H, q, J=7.1). IR (KBr) 2210, 1680, 1460, 1445, 1430 cm$^{-1}$. FDMS (m/e) 557 (M+) 315.

λ$_{max}$CH$_2$Cl$_2$ (ε): 406 (26,000). Anal. calc'd. for C$_{34}$H$_{28}$BNO$_2$S$_2$: C, 73.2; H, 5.1; N, 2.5. Found: C, 73.1; H, 5.3; N, 2.5.

EXAMPLE 16

Ethyl 2-(4,5-dihydronaphtho[1,2-d]-1,3-dithiol-2-ylidene)-2-tri(p-fluorophenyl)borylisocyanoacetate (D-23)

The same procedure was employed for the reaction as for Example 1 (D-1), but using the following materials: (1) tris(p-fluorophenyl)borane (1.14 g, 3.85 mmol) in tetrahydrofuran (10 mL); and (2) ethyl 2-(4,5-dihydronaphtho[1,2-d]-1,3-dithiol-2-ylidene)-2-isocyanoacetate (D-22a) (1.21 g, 3.85 mmol, mixture of olefin isomers) in tetrahydrofuran (10 mL). After the reaction slurry had stirred 30 min at 0° C., the solvent was removed under reduced pressure. The residue was triturated with ethanol to give D-23 (1.90 g, mixture of double bond isomers) as a yellow solid. The material was pure by NMR with the exception of a small amount of residual tetrahydrofuran.

A portion (0.885 g) was recrystallized from dichloromethane/ethanol (hot filtration) to give pure material (0.734 g) for analysis and yield (81% crude X 83% recovery=67% total yield). The pure material (a mixture of olefin isomers) was obtained as a yellow-orange solid (mp 117°–127° C., dec).

$^1$H NMR (300 MHz, CDCl$_3$) δ 7.31–7.22 (10H, m), 6.95 (6H, t, J=8.8), 4.34 (2H, q, J=7.1), 3.09–3.02 (2H, m), 2.84–2.78 (2H, m), 1.36 (3H, t, J=7.1). IR (KBr) 2220, 1685, 1585, 1470, 1445 cm$^{-1}$. FDMS (m/e) 611 (M+), 315, 296.

λ$_{max}$CH$_2$Cl$_2$ (ε): 406 (28,000). Anal. calc'd. for C$_{34}$H$_{25}$BF$_3$NO$_2$S$_2$: C, 66.8; H, 4.1; N, 2.3. Found: C, 66.8; H, 4.2; N, 2.3.

EXAMPLE 17

Preparation of Ethyl 4-(4,6-diphenyl-2-pyranylidene)-2-triphenylborylisocyano-2-butenoate (D-24)

(a) Preparation of Ethyl 4-(4,6-diphenyl-2-pyranylidene)-2-isocyano-2-butenoate (D-24a)

The same procedure was employed for the reaction as for Example 1 (D-1a), but using the following materials: (1) potassium t-butoxide (2.8 g, 25 mmol) in tetrahydrofuran (100 mL); (2) ethyl isocyanoacetate (2.82 g, 25 mmol) in tetrahydrofuran (20 mL); (3) 2-(2-dimethylaminovinyl)-4,6-diphenylpyrilium perchlorate (10 g, 25 mmol). Ethanol trituration of the residue obtained after solvent evaporation gave 3.58 g D-24a as a black crystalline solid. The crude material was recrystallized from ethanol with a hot filtration to give 2.12 g D-24a(1) as a black crystalline solid. The material that had crystallized in the filter funnel during the hot filtration was recrystallized from dichloromethane/ethanol to give 0.44 g D-24a(2). The mother and wash liquors from D-24a(1) and D-24a(2) were combined and the solvent was removed under reduced pressure. The residue was recrystallized from dichloromethane/ethanol to give 0.30 g D-24a(3) (mp 150.5°–152° C.). All three crops (total: 2.92 g, 32%) were homogeneous and identical by TLC (dichloromethane), but by NMR they were mixtures of double bond isomers in various proportions (D-24a(1): 4:1 isomer ratio; D-24a(2): 1:1 isomer ratio; D-24a(3): >9:1 isomer ratio). This was irrelevant for subsequent chemistry, so no attempt was made to separate them.

For simplicity, the NMR data for D-24a(3) is given. The other analytical data was essentially the same for all three crops.

$^1$H NMR (300 MHz, CDCl$_3$) δ 8.06 (1H, d, J=12.5), 7.86–7.83 (2H, m), 7.65–7.62 (2H, m), 7.54–7.52 (6H, m), 6.76 (1H, d, J=1.1), 6.70 (1H, d, J=1.0), 5.76 (1H, d, J=12.5), 4.35 (2H, q, J=7.1), 1.42 (3H, t, J=7.1). IR (KBr) 2110, 1700, 1635, 1585, 1575, 1545, 1510, 1490 cm$^{-1}$. FDMS (m/e) 369 (M+).

λ$_{max}$CH$_2$Cl$_2$ (ε): 536 (17,400), 504 (17,400), 407 (15,800), 388 (17,100), 309 (23,000). Anal. calc'd. for C$_{24}$H$_{19}$NO$_3$: C, 78.0; H, 5.2; N, 3.8. Found: C, 78.2; H, 5.3; N, 3.7.

(b) Preparation of Product (D-24)

The same procedure was employed for the reaction as for Example 1 (D-1), but using the following materials: (1) triphenylborane (0.607 g, 2.51 mmol) in tetrahydrofuran (5 mL); and (2) ethyl 4-(4,6-diphenyl-2-pyranylidene)-2-isocyano-2-butenoate (D-24a) (0.923 g, 2.51 mmol) in tetrahydrofuran (5 mL). After the reaction slurry had stirred 30 min at 0° C., the solvent was removed under reduced pressure. The residue was triturated with ether and filtered, giving a black solid (1.31 g). The crude product was dissolved in warm dichloromethane, filtered, and precipitated with ethanol to give pure D-24 (1.13 g, 73%, mixture of double bond isomers) as a black crystalline solid.

A small portion was purified by chromatography on silica gel (eluting with 20/80 dichloromethane/cyclohexane), then a second recrystallization, giving material for analysis (mp 148.5°–150° C.).

$^1$H NMR (300 MHz, CDCl$_3$) δ 8.20 (1H, d, J=13.0), 7.83 (2H, m), 7.64 (2H, m), 7.58–7.53 (6H, m), 7.42 (6H, d, J=6.9), 7.30 (6H, t, J=6.9), 7.21 (3H, t, J=7.2), 6.88 (1H, d, J=0.9), 6.47 (1H, s), 5.34 (1H, d, J=12.8), 4.36 (2H, q, J=7.1), 1.41 (3H, t, J=7.1), as well as small peaks from the minor olefin isomer. IR (KBr) 2220, 1710, 1633, 1585, 1573, 1543, 1507, 1485 cm$^{-1}$. FDMS (m/e) 611 (M+), 369.

λ$_{max}$CH$_2$Cl$_2$ (ε): 636 (8,400) (sh), 580 (20,000) (sh), 544 (24,300), 513 (20,900) (sh), 409 (13,900), 391 (13,100), 317 (20,300). Anal. calc'd. for C$_{42}$H$_{34}$BNO$_3$: C, 82.5; H, 5.6; N, 2.3. Found: C, 82.7; H, 5.8; N, 2.4.

EXAMPLE 18

Preparation of Ethyl
4-(4,6-diphenyl-2-pyranylidene)-2-tri(p-fluorophenyl)-
borylisocyano-2-butenoate (D-25)

The same procedure was employed for the reaction as for Example 1 (D-1), but using the following materials: (1) tris(p-fluorophenyl)borane (0.845 g, 2.85 mmol) in tetrahydrofuran (5 mL); and (2) ethyl 4-(4,6-diphenyl-2-pyranylidene)-2-isocyano-2-butenoate (D-24a) (1.05 g, 2.85 mmol) in tetrahydrofuran (5 mL). After the reaction slurry had stirred 30 min at 0° C., the solvent was removed under reduced pressure. The residue was triturated with ether and filtered, giving a black solid (1.13 g). The crude product was dissolved in warm dichloromethane, filtered, and precipitated with ethanol to give D-25 (0.780 g, mixture of double bond isomers) as an oily black crystalline solid. A second recrystallization gave pure D-25 as a black crystalline solid (0.560 g, 56%).

A small portion was purified by chromatography on silica gel (eluting with 20/80 dichloromethane/cyclohexane), then another recrystallization, giving material for analysis (mp 139°–141° C., dec).

$^1$H NMR (300 MHz, CDCl$_3$) δ 8.24 (1H, d, J=13.0), 7.88–7.84 (2H, m), 7.71–7.66 (2H, m), 7.60–7.56 (6H, m), 7.35–7.30 (6H, dd, J=6.3, 8.1), 7.05–6.99 (6H, t, J=8.8), 6.95 (1H, d, J=1.0), 5.28 (1H, d, J=13.0), 4.38 (2H, q, J=7.1), 1.42 (3H, t, J=7.1). IR (KBr) 1710, 1635, 1585, 1540, 1485 cm$^{-1}$. FDMS (m/e) 665 (M+), 369, 296.

λ$_{max}$CH$_2$Cl$_2$ (ε): 629 (9,400) (sh), 574 (21,000) (sh), 544 (25,100), 513 (21,500) (sh), 409 (14,100), 391 (13,100), 317 (20,700). Anal. calc'd. for C$_{42}$H$_{31}$BF$_3$NO$_3$: C, 75.8; H, 4.7; N, 2.1, Found: C, 75.4; H, 4.9; N, 2.0.

EXAMPLE 19

Preparation of Ethyl
4-(2,6-diphenyl-4-pyranylidene)-2-triphenyl-
borylisocyano-2-butenoate (D-29)

(a) Preparation of Ethyl
4-(2,6-diphenyl-4-pyranylidene)-2-isocyano-2-butenoate (D-29a)

The same procedure was employed for the reaction as for Example 1 (D-1a), but using the following materials: (1) potassium t-butoxide (1.68 g, 15 mmol) in tetrahydrofuran (50 mL); (2) ethyl isocyanoacetate (1.69 g, 15 mmol) in tetrahydrofuran (15 mL); (3) 2-(2-dimethylaminovinyl)-4,6-diphenylpyrilium perchlorate (6.02 g, 15 mmol). After the reaction was stirred overnight at ambient temperature, it was poured onto water (75 mL) and saturated ammonium chloride (25 mL), and extracted twice with ethyl acetate (75 mL). There was a large amount of undissolved orange solid, and it was removed from both the aqueous and organic layers by filtration. (It was usbsequently found to be unreacted starting material.) The aqueous layer was extracted once more with ethyl acetate, and the work-up completed as in Example 1 (D-1a). Ethanol trituration of the residue obtained after solvent evaporation gave 1.51 g (27%) D-29a as a flaky orange solid that was homogeneous by TLC (3:7 ethyl acetate/cyclohexane).

A small portion of the crude material was recrystallized from ethanol for analysis and melting point (mp 145°–145.5° C.).

$^1$H NMR (300 MHz, CDCl$_3$) δ 7.87–7.80 (4H, m) 7.84 (1H, d, J=12.6), 7.54–7.50 (6H, m), 6.99 (1H, s), 6.70 (1H, s), 6.00 (1H, d, J=12.9), 4.35 (2H, q, J=7.1), 1.40 (3H, t, J=7.1). IR (KBr): 2125, 1710, 1653, 1553, 1493 cm$^{-1}$. FDMS (m/e) 369 (M+).

λ$_{max}$CH$_2$Cl$_2$ (ε): 470 (36,800) (sh), 446 (40,600), 314 (13,800). Anal. calc'd. for C$_{24}$H$_{19}$NO$_3$: C, 78.0; H, 5.2; N, 3.8. Found: C, 78.1, H, 5.3; N, 3.7.

(b) Preparation of Product (D-29)

The same procedure was employed for the reaction as for Example 1 (D-1), but using the following materials: (1) triphenylborane (0.361 g, 1.49 mmol) in tetrahydrofuran (5 mL); and (2) ethyl 4-(2,6-diphenyl-4-pyranylidene)-2-isocyano-2-butenoate (D-29a) (0.550 g, 1.49 mmol) in tetrahydrofuran (5 mL). After the orange reaction slurry had stirred 30 min at 0° C., the solvent was removed under reduced pressure. The residue was triturated with ether and filtered, giving an orange solid (0.804 g). The crude product was dissolved in warm dichloromethane, filtered, and precipitated with ethanol to give pure D-29 (0.654 g, 73%) as a red-orange flaky solid (mp 117°–120° C., dec).

A second crop (0.060 g 7%) was also obtained (total yield 0.714 g, 80%).

$^1$H NMR (300 MHz, CDCl$_3$) δ 8.07 (1H, d, J=13.3), 7.92–7.85 (4H, m), 7.60–7.57 (6H, m), 7.46–7.43 (6H, m), 7.33 (6H, t, J=7.2), 7.25 (3H, t, J=7.1), 7.12 (1H, s), 6.48 (1H, d, J=0.9), 5.65 (1H, d, J=13.3), 4.39 (2H, q, J=7.1), 1.43 (3H, t, J=7.1). IR (KBr) 2225, 1710, 1650, 1565, 1545, 1493 cm$^{-1}$. FDMS (m/e) 611 (M+), 369.

λ$_{max}$CH$_2$Cl$_2$ (ε): 519 (18,800), 492 (29,500), 470 (25,700), 330 (8,000). Anal. calc'd. for C$_{42}$H$_{34}$BNO$_3$: C, 82.5; H, 5.6; N, 2.3. Found C, 80.7; H, 5.9; N, 2.2.

EXAMPLE 20

Preparation of Ethyl
4-(2,6-diphenyl-4-pyranylidene)-2-tri(p-fluorophenyl)-
borylisocyano-2-butenoate (D-30)

The same procedure was employed for the reaction as for Example 1 (D-1), but using the following materials: (1) tris(p-fluorophenyl)borane (0.475 g, 1.60 mmol) in tetrahydrofuran (5 mL); and (2) ethyl 4-(2,6-diphenyl-4-pyranylidene)-2-isocyano-2-butenoate (D-29a) (0.592 g, 1.60 mmol) in tetrahydrofuran (5 mL). After the orange reaction slurry had stirred 30 min at 0° C., the solvent was removed under reduced pressure. The residue was triturated with ether and filtered, giving an orange solid (0.854 g). The crude product was dissolved in warm dichloromethane, filtered and precipitated with ethanol to give pure D-30 (0.709 g, 67%) as a red-orange flaky solid (mp 114°–120° C., dec).

A second crop (0.016 g, 2%) was also obtained (total yield 0.725 g, 69%).

$^1$H NMR (300 MHz, CDCl$_3$) δ 8.08 (1H, d, J=13.3), 7.93–7.86 (4H, m), 7.64–7.59 (6H, m), 7.32 (6H, dd, J=6.5, 8.3), 7.14 (1H, s), 7.03 (6H, t, J=8.8), 6.49 (1H, s), 5.57 (1H, d, J=13.3), 4.39 (2H, q, J=7.1), 1.42 (3H, t, J=7.1). IR (KBr) 2225, 1710, 1650, 1585, 1567, 1545, 1493 cm$^{-1}$. FDMS (m/e) 665 (M+), 369.

λ$_{max}$CH$_2$Cl$_2$ (ε): 525 (32,200), 493 (48,700), 470 (41,700) (sh), 330 (12,800). Anal. calc'd. for C$_{42}$H$_{31}$BF$_3$NO$_3$: C, 75.8; H, 4.7; N, 2.1. Found: C, 75.4; H, 5.2; N, 2.2.

EXAMPLE 21

Preparation of Ethyl 4-(1-ethyl-4-quinolinylidene)-2-triphenylborylisocyano-2-butenoate (D-31)

(a) Preparation of Ethyl 4-(1-ethyl-4-quinolinylidene)-2-isocyano-2-butenoate (D-31a)

The same procedure was employed for the reaction as for Example 1 (D-1a) but using the following materials: (1) potassium t-butoxide (5.80 g, 51.8 mmol) in tetrahydrofuran (140 mL); (2) ethyl isocyanoacetate (5.86 g, 51.8 mmol) in tetrahydrofuran (60 mL); (3) 4-(2-acetanilidovinyl)-1-ethylquinolinium iodide (23.0 g, 51.8 mmol). After the reaction was stirred overnight at ambient temperature, it was poured onto water (300 mL) and saturated ammonium chloride (100 mL). Attempts to extract with ethyl acetate led to crystallization of the product, so the ethyl acetate/product suspension was evaporated under reduced pressure. The residue was dissolved in dichloromethane, and combined with dichloromethane extractions of the aqueous layer. The work-up was completed as in Example 1 (D-1a).

After filtration, the dichloromethane was concentrated to 100–150 mL, and then warmed to take the material into solution. Ethanol (150–200 mL) was added. Crystals formed upon cooling in the refrigerator, and these were collected by filtration to give 11.1 g (73%) D-31a as black flaky crystals (mp 161.5°–162.5° C.).

$^1$H NMR (300 MHz, CDCl$_3$) δ 8.17 (1H, d, J=8.2), 7.96 (1H, d, J=12.8), 7.57 (1H, t, J=7.7), 7.31 (2H, m), 7.01 (1H, d, J=5.6), 6.67 (1H, d, J=7.7), 6.46 (1H, d, J=12.9), 4.32 (2H, q, J=7.1), 4.06 (2H, q, J=7.2), 1.48 (3H, t, J=7.2), 1.39 (3H, t, J=7.1). IR (KBr) 2100, 1670, 1630, 1535 cm$^{-1}$. FDMS (m/e) 294 (M+).

λ$_{max}$CH$_2$Cl$_2$ (ε): 544 (35,000), 510 (39,000), 483 (24,000). Anal. calc'd. for C$_{18}$H$_{18}$N$_2$O$_2$: C, 73.4; H, 6.2; N, 9.5. Found: C, 73.0; H, 6.1; N, 9.4.

(b) Preparation of Product (D-31)

The same procedure was employed for the reaction as for Example 1 (D-1) but using the following materials: (1) triphenylborane (3.39 g, 14.0 mmol) in tetrahydrofuran (40 mL); and (2) ethyl 4-(1-ethyl-4-quinolinylidene)-2-isocyano-2-butenoate (D-31a) (4.12 g, 14.0 mmol) in tetrahydrofuran (125 mL). After the reaction slurry had stirred 30 min, warming from 0° C. to ambient temperature, ethanol (150 mL) was added and the precipitated product was isolated by filtration, washed with ethanol, and dried. A second crop was obtained by removing some of the solvent under reduced pressure (total crude yield, 6.31 g). The red-gold solid was dissolved in warm dichloromethane (250 mL), filtered, and ethanol (200 mL) was added to induce crystallization. The precipitate was collected by filtration, washed with ethanol, and dried (4.03 g) to give small red-gold crystals (mp 168°–168.5° C.).

A second crop have additional red-gold solid (1.99 g), for a total yield of 6.02 g, 80%).

$^1$H NMR (300 MHz, CDCl$_3$) δ 8.12 (1H, d, J=13.4), 7.64 (1H, t, J=7.9), 7.52–7.18 (19H, m), 6.87 (1H, d, J=7.6), 6.24 (1H, d, J=13.5), 4.32 (2H, q, J=7.1), 4.16 (2H, q, J=7.1), 1.50 (3H, t, J=7.2), 1.40 (3H, t, J=7.1). IR (KBr) 1690, 1620, 1530 cm$^{-1}$. FDMS (m/e) 536 (M+), 294.

λ$_{max}$CH$_2$Cl$_2$ (ε): 555 (85,000), 519 (53,000, 489 (20,000) (sh). Anal. calc'd. for C$_{36}$H$_{33}$BN$_2$O$_2$: C, 80.6; H, 6.2; N, 5.2. Found: C, 80.5; H, 6.1; N, 5.1.

EXAMPLE 22

Preparation of Ethyl 4-(1-ethyl-4-quinolinylidene)-2-tri(p-fluorophenyl)-borylisocyano-2-butenoate (D-32)

The same procedure was employed for the reaction as for Example 1 (D-1) but using the following materials: (1) tris(p-fluorphenyl)borane (4.00 g, 13.5 mmol) in tetrahydrofuran (40 mL); and (2) ethyl 4-(1-ethyl-4-quinolinylidene)-2-isocyano-2-butenoate (D-31a) (3.98 g, 13.5 mmol) in tetrahydrofuran (125 mL). The reaction was stirred 30 min, warming from 0° C. to ambient temperature. The solvent was removed under reduced pressure, and the residue was triturated with ethanol (75 mL). After warming slightly then recooling, the resulting product was isolated by filtration, washed with ethanol, and dried to give a dark green solid (7.11 g). Recrystallization from dichloromethane/ethanol (hot filtration) gave pure D-32 (6.25 g, 78%) as small dark green needles (mp 164.5°–166° C.).

$^1$H NMR (300 MHz, CDCl$_3$) δ 8.10 (1H, d, J=13.5), 7.66 (1H, t, J=7.8), 7.41 (2H, m), 7.36–7.26 (8H, m), 6.96 (6H, t, J=8.8), 6.89 (1H, d, J=4.6), ;b 6.12 (1H, d, J=13.4), 4.30 (2H, q, J=7.1), 4.17 (2H, q, J=7.1), 1.50 (3H, t, J=7.2), 1.36 (3H, t, J=7.1). IR (KBr) 1690, 1620, 1585, 1530, 1495 cm$^{-1}$. FDMS (m/e) 590 (M+), 294.

λ$_{max}$CH$_2$Cl$_2$ (ε): 555 (90,000), 519 (54,000). Anal. calc'd. for C$_{36}$H$_{30}$BF$_3$N$_2$O$_2$: C, 73.2; H, 5.1; N, 4.7. Found: C, 73.3; H. 5.4; N, 4.4.

EXAMPLE 23

Preparation of Ethyl 3-dimethylamino-2-triphenylborylisocyano-2-propenoate (D-33)

The same procedure was employed for the reaction as for Example 1 (D-1) but using the following materials: (1) triphenylborane (1.99 g, 8.22 mmol) in tetrahydrofuran (10 mL); and (2) 3-dimethylamino-2-isocyano-2-propenoate (1.38 g, 8.22 mmol, prepared as described in U. Schollkopf, P.-H. Porsch, H.-H. Lau, Justus Liebigs Ann. Chem., 1444 (1979) in tetrahydrofuran (10 mL). The reaction was allowed to warm to ambient temperature and stir overnight, then the solvent was evaporated under reduced pressure. The resulting oily solid was triturated with ether, and the product was isolated by filtration as a light yellow solid (1.87 g, 55%).

In another experiment, recrystallization from methylene chloride/cyclohexane (hot filtration) gave analytically pure material as a white crystalline solid (mp 114°–116.5° C.).

$^1$H NMR (270 MHz, CDCl$_3$) δ 7.35 (1H, s), 7.28 (6H, dd, J=1.5, 8), 7.22–7.05 (9H, m) 4.23 (2H, q, J=7), 3.09 (3H, br s), 2.78 (3H, br s), 1.32 (3H, q, J=7). IR (KBr) 2225, 1720, 1650 cm$^{-1}$. FDMS (m/e) 410 (M+), 242.

λ$_{max}$CH$_2$Cl$_2$ (ε): 294 (20,400). Anal. calc'd. for C$_{26}$H$_{27}$BN$_2$O$_2$: C, 76.1; H, 6.6; N, 6.8; B, 2.6. Found: C, 76.3; H, 6.6; N, 6.8; B, 2.7.

EXAMPLE 24

Preparation of Ethyl 3-dimethylamino-2-tri(p-fluorophenyl)borylisocyano-2-propenoate (D-34)

The same procedure was employed for the reaction as for Example 1 (D-1) but using the following materials: (1) tris(p-fluorophenyl)borane (0.913 g, 3.1 mmol) in tetrahydrofuran (10 mL); and (2) 3-dimethylamino-2-isocyano-2-propenoate (see Example 23) (0.518 g, 3.08 mmol) in tetrahydrofuran (5 mL). The reaction was stirred 1 hour at 0° C. and 1 hour at ambient temperature, then the solvent was evaporated under reduced pressure. Trituration with ether gave D-34 (0.76 g, 53%) as a white crystalline solid.

A small portion was recrystallized from methylene chloride/ether for analysis (mp 124.5°–127.5° C.).

$^1$H NMR (270 MHz, CDCl$_3$) δ 7.40 (1H, s), 7.18 6H, dd, J=6, 8.5), 6.92 (6H, m), 4.28 (2H, q, J=7), 3.18 (3H, br s), 2.88 (3H, br s), 1.36 (3H, t, J=7). IR (KBr) 2225, 1705, 1640 cm$^{-1}$. FDMS (m/e) 464 (M+), 296. $\lambda_{max}$CH$_2$Cl$_2$ (ε): 293 (19,500).

Anal. calc'd. for C$_{26}$H$_{24}$BF$_3$N$_2$O$_2$: C, 67.3; H, 5.2; N, 6.0; B, 2.3. Found: C, 67.2; H, 5.3; N, 6.0; B, 2.0.

EXAMPLE 25

Preparation of Ethyl 3,3-bis(dimethylamino)-2-triphenylborylisocyano-2-propenoate (D-36)

(a) Preparation of Ethyl 3,3-bis(dimethylamino)-2-isocyano-2-propenoate (D-36a)

To a slurry of potassium t-butoxide (4.48 g, 40 mmol) in dry, distilled tetrahydrofuran (40 mL) in a 3-neck 250 mL flask at −78° C., under argon was added dropwise from an addition funnel a solution of ethyl isocyanoacetate (4.52 g, 40 mmol) in dry, distilled tetrahydrofuran (40 mL). The anion was allowed to form for 25 min at −78° C., then solid bis(dimethylamino)ethoxymethylium tetrafluoroborate [9.28 g, 40 mmol, prepared as described by von H. Meerwein, W. Florian, N. Schon, G. Stopp, Justus Liebigs Ann. Chem. 641, 1, (1960)] was added as quickly as possible through a powder funnel with a stream of argon. The reaction was allowed to warm to ambient temperature and stir for 4 hours. It was then poured onto water (200 mL) and saturated ammonium chloride (40 mL) and extracted three times with ethyl acetate (100 mL). The combined extracts were washed with water and saturated sodium chloride, dried over sodium sulfate, and the solvent removed under reduced pressure. The resulting brown oil (6.9 g) was flash chromatographed, eluting with ethyl acetate, to give slightly impure D-36a as a brown oil (4.78 g, 57%). It was used without further purification $^1$H NMR (90 MHz, CDCl$_3$) δ 4.16 (2H, q, J=7), 2.87 (12H, s), 1.32 (3H, t, J=7).

(b) Preparation of Product (D-36)

The same procedure was employed for the reaction as for Example 1 (D-1), but using the following materials: (1) triphenylborane (1.94 g, 8.02 mmol) in tetrahydrofuran (8 mL); and (2) 3,3-bis(dimethylamino)-2-isocyano-2-propenoate (D-36a) (1.69 g, 8.02 mmol) in tetrahydrofuran (8 mL). After the reaction had stirred 1.5 hour at 0° C., the solvent as evaporated under reduced pressure.

The residue was recrystallized from ethanol (hot filtration) to give pure D-36 (2.63 g, 72%) as an off-white crystalline solid (mp 141.5°–143° C.).

$^1$H NMR (300 MHz, CDCl$_3$) δ 7.35 (6H, d, J=6.8), 7.25 (6H, t, J=7.1), 7.17 (3H, d, J=7.1), 4.23 (2H, q, J=7.1), 2.92 (6H, br s), 2.72 (3H, br s), 2.65 (3H, br s), 1.35 (3H, t, J=7.1). IR (IBr) 1700, 1570, 1540 cm$^{-1}$. FDMS (m/e) 453 (M+), 242, 211. $\lambda_{max}$CH$_2$Cl$_2$ (ε): 296 (19,200).

Anal. calc'd. for C$_{28}$H$_{32}$BN$_3$O$_2$: C, 74.2; H, 7.1; N, 9.3. Found: C, 74.4; H, 7.1; N, 9.2.

EXAMPLE 26

Preparation of Ethyl 3,3-bis(dimethylamino)-2-tri(p-fluorophenyl)-borylisocyano-2-propenoate (D-37)

The same procedure was employed for the reaction as for Example 1 (D-1), but using the following materials: (1) tris(p-fluorophenyl)borane (1.96 g, 6.62 mmol) in tetrahydrofuran (6 mL); and (2) 3,3-bis(dimethylamino)-2-isocyano-2-propenoate (D-36a) (1.40 g, 6.62 mmol) in tetrahydrofuran (6 mL). After the reaction had stirred 1 hour at 0° C., the solvent was evaporated under reduced pressure. The residue was chromatographed on silica gel, eluting with ethyl acetate to give a light tan solid (2.69 g).

It was recrystallized from ethanol (hot filtration) to give pure D-37 (2.23 g, 66%) as a white crystalline solid (mp 150.5°–152.5° C.).

$^1$H NMR (300 MHz, CDCl$_3$) δ 7.23 (6H, dd, J=6.4, 8.2), 6.94 (6H, t, J=8.9), 4.22 (2H, q, J=7.1), 2.94 (6H, br s), 2.76 (3H, br s), 1.31 (3H, t, J=7.1). IR (IBr) 1700, 1600, 1565, 1540, 1505 cm$^{-1}$. FDMS (m/e) 507 (M+), 296. $\lambda_{max}$CH$_2$Cl$_2$ (ε): 295 (19,300).

Anal. calc'd. for C$_{28}$H$_{29}$BF$_3$N$_3$O$_2$: C, 66.5; H, 5.8; N, 8.3. Found: C, 66.5; H, 5.8; N, 8.2.

EXAMPLE 27

Preparation of Ethyl 2-(1,3-dimethyl-2-imidazolidinylidene)-2-triphenylborylisocyano-2-acetate (D-39)

(a) Preparation of Ethyl 2-(1,3-dimethyl-2-imidazolidinylidene)-2-isocyanoacetate (D-39a)

A slurry of 1,3-dimethyl-2-ethoxy-4,5-dihydroimidazolium tetrafluoroborate (100 mmol as 100% of theory) was prepared as described by von H. Meerwein, W. Florian, N. Schon, G. Stopp, Liebigs Ann. Chem. 641, 1, (1960), using the following materials: (1) boron trifluoride etherate (19.0 g, 134 mmol); (2) epichlorohydrin (9.25 g, 100 mol); and (3) 1,3-dimethylimidazolidin-2-one (11.4 g, 100 mmol).

The anion of ethyl isocyanoacetate was made as follows: To a slurry of potassium t-butoxide (11.2 g, 100 mmol) in dry, distilled tetrahydrofuran (80 mL) in a 3-neck 500 mL flask at −78° C. under argon was added dropwise from an addition funnel a solution of ethyl isocyanoacetate (11.3 g, 100 mmol) in dry, distilled tetrahydrofuran (80 mL). The anion was allowed to form for 25 min at −78° C., then the flask was equipped with an overhead stirrer. The slurry of the tetrafluoroborate salt was added as quickly as possible through a powder funnel with a stream of argon. The reaction was stirred 15 min at −78° C., then was allowed to warm to ambient temperature and stir overnight. It was then diluted with water (100 mL) and ethyl acetate and filtered through celite. The filtrated was transferred to an addition funnel and extracted three times with ethyl acetate. The combined extracts were washed with water and saturated sodium chloride, dried over sodium sulfate, and the solvent removed under reduced pressure. The residue (15 g) was a black oil containing some solid. When the material was loaded on a silica gel column for flash chromatography with ethyl acetate, the solid would not dissolve (1.40 g, pure D-39a by TLC and NMR). The material on the column was eluted with ethyl acetate, to give a brown solid that was a mixture of the product D-39a and the urea starting material.

The material was recrystallized from ethyl acetate to give the product (2.68 g) as a light tan crystalline solid (total yield 4.08 g, 20%). A small portion was recrystallizwd from ethyl acetate for analysis and melting point (mp 102°–103° C.).

$^1$H NMR (300 MHz, CDCl$_3$) δ 4.18 (2H, q, J=7.1), 3.66 (4H, s), 3.02 (6H, s), 1.32 (3H, t, J=7.1). IR (KBr) 1660, 1545 cm$^{-1}$. FDMS (m/e) 209 (M+).

Anal. calc'd, for C$_{10}$H$_{15}$N$_3$O$_2$: C, 57.4; H, 7.2; N, 20.1. Found: C, 57.4; H, 7.1; N, 20.0.

(b) Preparation of Product D-39

The same procedure was employed for the reaction as for Example 1 (D-1), but using the following materials: (1) triphenylborane (2.20 g, 9.1 mmol) in tetrahydrofuran (20 mL); and (2) ethyl 2-(1,3-dimethyl-2-imidazolidinylidene)-2-isocyanoacetate (D-39a) (1.90 g, 9.1 mmol) in tetrahydrofuran (20 mL). After the reaction had stirred 1 hour at 0° C., the solvent was evaporated under reduced pressure.

The residue was recrystallized from ethanol (hot filtration) to give (in two crops) pure D-39 (2.59 g, 63%) as a white crystalline solid (,mp 167°–169° C.).

$^1$H NMR (300 MHz, CDCl$_3$) δ 7.36 (6H, d, J=6.9), 7.24 (6H, app t, J=7.2), 7.15 (3H, t, J=7.1), 4.23 (2H, q, J=7.1), 3.61 (4H, s), 2.82 (6H, s), 1.35 (3H, t, J=7.1). IR (KBr) 1680, 1545 cm$^{-1}$. FDMS (m/e) 451 (M+), 450. λ$_{max}$CH$_2$Cl$_2$ (ε): 286 (12,600).

Anal. calc'd, for C$_{28}$H$_{30}$BN$_3$O$_2$: C, 74.5; H, 6.7; N, 9.3. Found: C, 74.3; H, 6.7; N, 9.3.

EXAMPLE 28

Preparation of Ethyl 2-(1,3-dimethyl-2-imidazolidinylidene)-2-tri(p-fluorophenyl)borylisocyanoacetate (D-40)

The same procedure was employed for the reaction as for Example 1 (D-1), but using the following materials: (1) tris(p-fluorophenyl)borane (2.63 g, 8.89 mmol) in tetrahydrofuran (20 mL); and (2) ethyl 2-(1,3-dimethyl-2-imidazolidinylidene)-2-isocyanoacetate (D-39a) (1.86 g, 8.89 mmol) in tetrahydrofuran (20 mL). After the reaction had stirred 1 hour at 0° C., the solvent was evaporated under reduced pressure.

The residue was recrystallized from ethanol (hot filtration) to give pure D-40 (3.36 g, 75%) as a white crystalline solid (mp 165.5°–167° C.).

$^1$H NMR (300 MHz, CDCl$_3$) δ 7.24 (6H, dd, J=6.4, 8.3), 6.93 (6H, app t, J=8.9), 4.22 (2H, q, J=7.1), 3.67 (4H, s), 2.84 (6H, s), 1.32 (3H, t, J=7.1). IR (KBr) 1680, 1595, 1550, 1500 cm$^{-1}$. FDMS (m/e) 505 (M+), 504. λ$_{max}$CH$_2$Cl$_2$ (ε): 280 (12,900).

Anal. calc'd, for C$_{28}$H$_{27}$BF$_3$N$_3$O$_2$: C, 66.5 H, 5.4; N, 8.3. Found: C, 66.2; H, 5.5; N, 8.3.

TABLE II

Analytical Data for Intermediates*

| Dye | λ$_{max}$nm | ε | M.P. °C. | Mol. Formula | Calc'd. For C | H | N | Found C | H | N |
|---|---|---|---|---|---|---|---|---|---|---|
| D-1a | 443 | 62,000 | 134–134.5 | C$_{16}$H$_{16}$N$_2$O$_2$S | 64.0 | 5.4 | 9.3 | 63.9 | 5.4 | 9.3 |
| D-3a | 347 | 39,000 | 168.5–171 | C$_{14}$H$_{14}$N$_2$O$_2$S | 61.3 | 5.1 | 10.2 | 61.7 | 5.2 | 10.2 |
| D-5a | 509 | 62,000 | 163–165 | C$_{18}$H$_{18}$N$_2$O$_2$S | 66.2 | 5.6 | 8.6 | 66.1 | 5.6 | 8.5 |
| D-8a | 408 | 72,000 | 135–136.5 | C$_{16}$H$_{16}$N$_2$O$_3$ | 67.6 | 5.7 | 9.9 | 67.6 | 5.8 | 9.8 |
| D-10a | 490 | 71,000 | 154.5–155.5 | C$_{18}$H$_{18}$N$_2$O$_3$ | 69.7 | 5.8 | 9.0 | 69.5 | 5.6 | 8.9 |
| D-16a | 480 | 42,500 | 137.5–139 | C$_{18}$H$_{18}$N$_2$O$_2$ | 73.4 | 6.2 | 9.5 | 73.7 | 6.3 | 9.5 |
|  | 455 | 39,000 |  |  |  |  |  |  |  |  |
| D-19a | 440 | 112,000 | 245–250 | C$_{18}$H$_{19}$Cl$_2$N$_3$O$_2$ | 56.9 | 5.0 | 11.1 | 56.5 | 5.1 | 10.8 |
|  | 422 | 61,000 | (sh) |  |  |  |  |  |  |  |
| D-22a(1) | 391 | 25,000 | 184.5–188 | C$_{16}$H$_{13}$NO$_2$S$_2$ | 60.9 | 4.2 | 4.4 | 60.8 | 4.3 | 4.4 |
|  | 377 | 21,000 |  |  |  |  |  |  |  |  |
| D-22a(2) | 390 | 25,000 | 175–177 | C$_{16}$H$_{13}$NO$_2$S$_2$ | 60.9 | 4.2 | 4.4 | 60.6 | 4.2 | 4.3 |
|  | 377 | 21,000 |  |  |  |  |  |  |  |  |
| D-24a | 536 | 17,400 | 150.5–152 | C$_{24}$H$_{19}$NO$_3$ | 78.0 | 5.2 | 3.8 | 78.2 | 5.3 | 3.7 |
|  | 504 | 17,400 |  |  |  |  |  |  |  |  |
|  | 407 | 15,800 |  |  |  |  |  |  |  |  |
|  | 388 | 17,100 |  |  |  |  |  |  |  |  |
|  | 309 | 23,000 |  |  |  |  |  |  |  |  |
| D-29a | 470 | 36,800 | (sh) 145–145.5 | C$_{24}$H$_{19}$NO$_3$ | 78.0 | 5.2 | 3.8 | 78.1 | 5.3 | 3.7 |
|  | 446 | 40,600 |  |  |  |  |  |  |  |  |
| D-31a | 544 | 35,000 | 161.5–162.5 | C$_{18}$H$_{18}$N$_2$O$_2$ | 73.4 | 6.2 | 9.5 | 73.0 | 6.1 | 9.4 |
|  | 510 | 39,000 |  |  |  |  |  |  |  |  |
| D-39a | 483 | 24,000 | 102–103 | C$_{10}$H$_{15}$N$_3$O$_2$ | 57.4 | 7.2 | 20.1 | 57.4 | 7.1 | 20.0 |

*All compounds were also characterized by 300 MHz $^1$H NMR, IR, and FDMS.

TABLE III

Analytical and Absorption Data for the Polymethines*

| Dye | λ$_{max}$nm | ε | M.P. °C. | Mol. Formula | Calc'd. For C | H | N | Found C | H | N |
|---|---|---|---|---|---|---|---|---|---|---|
| D-1 | 462 | 87,000 | 160–161 | C$_{34}$H$_{31}$BN$_2$O$_2$S | 75.3 | 5.8 | 5.2 | 75.7 | 5.9 | 5.2 |
| D-2 | 463 | 86,000 | 164–166 | C$_{34}$H$_{28}$BF$_3$N$_2$O$_2$S | 68.5 | 4.7 | 4.7 | 68.3 | 4.9 | 4.6 |
| D-3 | 349 | 46,000 | 140–142 | C$_{32}$H$_{29}$BN$_2$O$_2$S | 74.4 | 5.7 | 5.4 | 74.7 | 5.8 | 5.4 |
| D-4 | 349 | 46,000 | 158–160 | C$_{32}$H$_{26}$BF$_3$N$_2$O$_2$S | 67.4 | 4.6 | 4.9 | 67.3 | 4.8 | 4.9 |
| D-5 | 555 | 112,000 | 187–189 | C$_{36}$H$_{33}$BN$_2$O$_2$S | 76.1 | 5.9 | 4.9 | 75.8 | 5.8 | 5.2 |

TABLE III-continued
Analytical and Absorption Data for the Polymethines*

| Dye | $\lambda_{max}$nm | $\epsilon$ | M.P. °C. | Mol. Formula | Calc'd. For C | H | N | Found C | H | N |
|---|---|---|---|---|---|---|---|---|---|---|
| D-6 | 556 | 118,000 | 146.5-147 | $C_{36}H_{30}BF_3N_2O_2S$ | 69.5 | 4.9 | 4.5 | 69.2 | 5.1 | 4.5 |
| D-8 | 424 | 87,000 | 151-151.5 | $C_{34}H_{31}BN_2O_3$ | 77.6 | 5.9 | 5.3 | 77.5 | 5.9 | 5.3 |
| D-9 | 425 | 91,000 | 156.5-158 | $C_{34}H_{28}BF_3N_2O_3$ | 70.4 | 4.9 | 4.8 | 70.1 | 4.8 | 4.7 |
| D-10 | 520 | 102,000 | 145-148(dec) | $C_{36}H_{33}BN_2O_3$ | 78.3 | 6.0 | 5.1 | 78.1 | 6.1 | 5.0 |
| D-11 | 521 | 101,000 | 167.5-169(dec) | $C_{36}H_{30}BF_3N_2O_3$ | 71.3 | 5.0 | 4.6 | 70.9 | 5.1 | 4.5 |
| D-16 | 509 | 47,000 | 174-175(dec) | $C_{36}H_{33}BN_2O_2$ | 80.6 | 6.2 | 5.2 | 80.2 | 6.2 | 5.2 |
|  | 480 | 57,000 |  |  |  |  |  |  |  |  |
| D-17 | 507 | 48,500 | 175-176(dec) | $C_{36}H_{30}BF_3N_2O_3$ | 73.2 | 5.1 | 4.7 | 73.2 | 5.4 | 4.7 |
|  | 479 | 55,000 |  |  |  |  |  |  |  |  |
| D-19 | 446 | 116,000 | 178-180(dec) | $C_{36}H_{34}BCl_2N_3O_2$ | 69.5 | 5.5 | 6.8 | 69.6 | 5.6 | 6.9 |
| D-20 | 445 | 102,000 | 144-148(dec) | $C_{36}H_{31}BCl_2F_3N_3O_2$ | 63.9 | 4.6 | 6.2 | 63.8 | 4.6 | 6.1 |
| D-22 | 406 | 26,000 | 119-121(dec) | $C_{34}H_{28}BNO_2S_2$ | 73.2 | 5.1 | 2.5 | 73.1 | 5.3 | 2.5 |
| D-23 | 406 | 28,000 | 117-127(dec) | $C_{34}H_{25}BF_3NO_2S_2$ | 66.8 | 4.1 | 2.3 | 66.8 | 4.2 | 2.3 |
| D-24 | 544 | 24,300 | 148.5-150 | $C_{42}H_{34}BNO_2$ | 82.5 | 5.6 | 2.3 | 82.7 | 5.8 | 2.4 |
|  | 513 | 20,900 |  |  |  |  |  |  |  |  |
|  | 391 | 13,100 |  |  |  |  |  |  |  |  |
|  | 317 | 20,300 |  |  |  |  |  |  |  |  |
| D-25 | 544 | 25,100 | 139-141(dec) | $C_{42}H_{31}BF_3NO_3$ | 75.8 | 4.7 | 2.1 | 75.9 | 5.0 | 2.0 |
|  | 409 | 14,100 |  |  |  |  |  |  |  |  |
|  | 391 | 13,100 |  |  |  |  |  |  |  |  |
|  | 317 | 20,700 |  |  |  |  |  |  |  |  |
| D-29 | 519 | 18,800 | 117-120(dec) | $C_{42}H_{34}BNO_3$ | 82.5 | 5.6 | 2.3 | 80.7 | 5.9 | 2.2 |
|  | 492 | 29,500 |  |  |  |  |  |  |  |  |
|  | 470 | 25,700 |  |  |  |  |  |  |  |  |
|  | 330 | 8,000 |  |  |  |  |  |  |  |  |
| D-30 | 525 | 32,200 | 114-120(dec) | $C_{42}H_{31}BF_3NO_3$ | 75.8 | 4.7 | 2.1 | 75.5 | 5.2 | 2.3 |
|  | 493 | 48,700 |  |  |  |  |  |  |  |  |
|  | 330 | 12,800 |  |  |  |  |  |  |  |  |
| D-31 | 555 | 85,000 | 168-168.5 | $C_{36}H_{33}BN_2O_2$ | 80.6 | 6.2 | 5.2 | 80.7 | 6.7 | 5.1 |
|  | 519 | 53,000 |  |  |  |  |  |  |  |  |
| D-32 | 555 | 90,000 | 164.5-166 | $C_{36}H_{30}BF_3N_2O_2$ | 73.2 | 5.1 | 4.7 | 73.3 | 5.4 | 4.4 |
|  | 519 | 54,000 |  |  |  |  |  |  |  |  |
| D-33 | 294 | 20,400 | 114-116.5 | $C_{26}H_{27}BN_2O_2$ | 76.1 | 6.6 | 6.8 | 76.3 | 6.6 | 6.8 |
| D-34 | 293 | 19,500 | 124.5-127.5 | $C_{26}H_{24}BF_3N_2O_2$ | 67.3 | 5.2 | 6.0 | 67.2 | 5.3 | 6.0 |
| D-36 | 296 | 19,200 | 141.5-143 | $C_{28}H_{32}BN_3O_2$ | 74.2 | 7.1 | 9.3 | 74.4 | 7.1 | 9.2 |
| D-37 | 295 | 19,300 | 150.5-152.5 | $C_{28}H_{29}BF_3N_3O_2$ | 66.3 | 5.8 | 8.3 | 66.5 | 5.8 | 8.2 |
| D-39 | 286 | 12,600 | 167-169 | $C_{28}H_{30}BN_3O_2$ | 74.5 | 6.7 | 9.3 | 74.3 | 6.7 | 9.3 |
| D-40 | 280 | 12,900 | 165.5-167 | $C_{28}H_{27}BF_3N_3O_2$ | 66.5 | 5.4 | 8.3 | 66.2 | 5.5 | 8.3 |

*All compounds were also characterized by 300 MHz $^1$H NMR, IR, and FDMS.

From Tables II and III it is apparent that close agreement between the calculated and found elemental content of the compounds was observed. The peak absorption ($\lambda_{max}$) of the compounds was measured in dichloromethane. The extinction coefficient ($\epsilon$), in liters/mole-cm was measured in solution at the peak absorption. Several of the dyes exhibited more than one absorption peak, as indicated in the Table II. Most of the compounds were clearly dyes—i.e., they exhibited an an extinction coefficient of greater than 5,000 liters/mole-cm in the wavelength range within the visible spectrum of 400 to 700 nm. All of the remaining compounds were ultraviolet absorbers.

EXAMPLES 29 through 33

A series of negative working photoresist compositions PR-1 each containing 0.02 millimole of a different dye being tested as a photosensitizer were prepared.
PR-1 was formulated as follows:

| 2.34 g | Binder A |
| 1.17 g | Monomer A |
| 1.17 g | Monomer B |
| 0.012 g | Inhibitor A |
| 0.077 g | Activator A |
| 0.02 mmol | Photosensitizer |
| 10.32 g | Solvent (Dichloromethane) |

Binder A exhibited the following structure

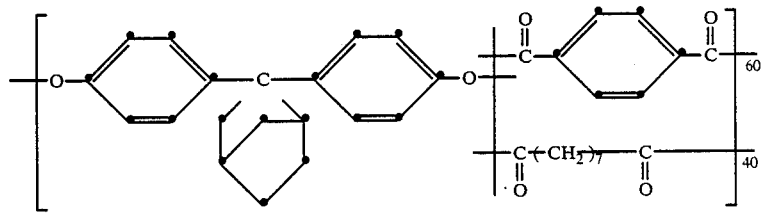

Monomer A exhibited the following structure

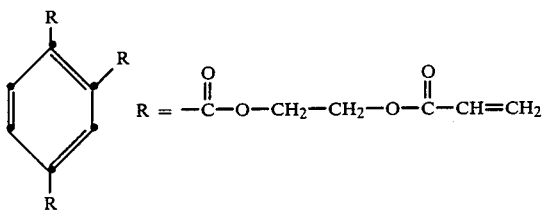

Monomer B exhibited the following structure

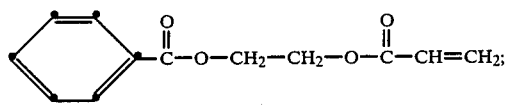

Inhibitor A exhibited the following structure

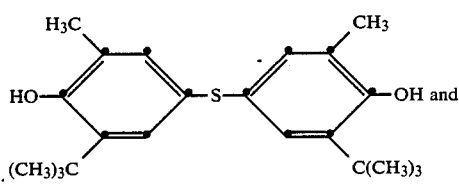

Activator A was 1-methoxy-4-phenylpyridinium tetrafluoroborate.

Each of the photoresist compositions was coated on a copper sheet using a 0.3 mm coating knife and dried for 10 minutes at about 70° C. A transparent polypropylene cover sheet was then placed over the coating.

Since PR-1 without the photosensitizer coinitiator responds to ultraviolet exposures, shorter wavelengths were removed during exposures, shorter wavelengths were removed during exposure using filters. Specifically, wavelengths below the absorption peak of the photosenitizer dye were removed using a W-2A Wratten ® filter capable of filtering 99.9 percent of radiation of less than 400 nm in wavelength.

To determine the degree of effectiveness of the photosensitizer exposure of each coated sample was undertaken through a Kodak T-14 ® step tablet having 14 equal increment density steps ranging in density from essentially zero to 2.1. Three minute exposures were undertaken using a Nu-arc FT32L ® flip-top platemaker equipped with a 4000 watt pulses Xenon lamp. After exposure the samples were baked for 10 minutes at 70° C. and spray developed for two minutes. Development was undertaken using 1,1,1-trichloroethane as a developer. Response was measured in terms of the number of stepped exposure areas (steps) in which the photoresist was retained following exposure. For example, a photoresist sample which was retained following exposure and development on 10 steps, but was absent from the remaining four steps was assigned a step rating of 10. If partial retention of the photoresist was observed on the eleventh step, this was indicated by assigning a plus rating—i.e., 10+. On the oter hand, where the photoresist retention was deemed just barely adequate to merit the step rating, this was indicated by assigning a minus rating—i.e., 10—.

Results with the various dyes are indicated below in Table IV, which reports the absorption peak of the dye in the coating and the step range of response. Activator A exhibited a reduction potential of −0.75 volt, and each of the dye photosensitizers exhibited a reduction potential less than 0.1 volt more positive than the reduction potential of Activator A.

When control formulations of PR-1 were prepared varied only by omitting the dye, so that Activator A was the sole initiator present, performance of the procedure described above and including the filtering used with the dyes resulted in no imaging response being observed. This showed the activator to be ineffective to impart sensitivity to the photoresist in the blue portion of the spectrum.

The dyes employed as photosensitizers, their maximum absorption wavelengths ($\lambda_{max}$), and the number of steps of retained photoresist after development are shown in Table IV.

TABLE IV

| Dye | $\lambda_{max}$ (nm) | Steps |
|---|---|---|
| D-5 | 563 | 10+ |
| D-6 | 564 | 10+ |
| D-9 | 432 | 5 |
| D-10 | 529 | 10+ |
| D-17 | 486 | 6 |

By comparing the maximum absorption wavelengths of the dyes in solution in Table III with the maximum absorption wavelengths of the dyes in the photoresist it is apparent that the maximum absorption wavelength was bathochromically shifted in the imaging composition. All of the dyes of the invention tested in the photoresist composition PR-1 were found to be useful as photosensitizers. All of these dyes exhibited a reduction potential more negative than −0.75 volt.

The invention has been described in detail with particular reference to preferreds embodiments thereof, but it will be understood that variations and modifications can be effected within the spirit and scope of the invention.

What is claimed is:

1. A polymethine dye or ultraviolet absorber of the formula:

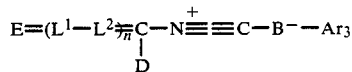

where

Ar is independently in each occurrence an aromatic nucleus containing from 6 to 10 ring carbon atoms;

D is an electron withdrawing group having a cyano, sulfo, or carbonyl group;

E is chosen from the class consisting of
 (i) a heterocyclic nucleus comprises of a five or six membered heterocyclic ring containing at least one heteroatom chosen from the class consisting of nitrogen and chalcogen and
 (ii) an aminomethine group;

$L^1$ and $L^2$ are methine groups; and n is the integer 0, 1, or 2.

2. A polymethine dye or ultraviolet absorber accordaing to claim 1 wherein n is 1 or 2.

3. A polymethine dye or ultraviolet absorber according to claim 2 wherein D is a sulfo group.

4. A polymethine dye or ultraviolet absorber according to claim 1 wherein D is a carboxylic ester group.

5. A polymethine dye or ultraviolet absorber according to claim 1 wherein E is comprised of an azolinylidene or azinylidene heterocyclic ring.

6. A polymethine dye or ultraviolet absorber according to claim 1 wherein E is an aminomethine group, the amino moiety of which is derived from a secondary amine.

7. A polymethine dye or ultraviolet absorber according to claim 6, wherein the cyclic secondary amine is chosen from the group consisting of a pyrrolidine, 3-pyrroline, piperidine, piperazine, morpholine, 1,2,3,4-tetrahydroquinoline, decahydroquinoline, 3-azabicyclo[3,2,2]nonane, indoline, azetidine, and hexahydroazepine.

8. A polymethine dye or ultraviolet absorber of the formula:

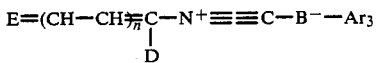

where
D is a —C≡N, —S(O)$_2$OR, —C(O)R, or —C(O)OR;
E represents the atoms completing an aromatic heterocyclic nucleus comprised of an azolinylidene, azinylidene, pyranylidene, thiopyranylidene, selenapyranylidene, tellurapyranylidene, or dithiolylidene ring;
n is the integer 0, 1, or 2; and
R is chosen from the class consisting of alkyl, alkenyl, alkynyl, aryl, alkaryl, and aralkyl, wherein said alkyl, alkenyl, and alkynyl moieties contain from 1 to 15 carbon atoms and said aryl moieties contain from 6 to 10 carbon atoms.

9. A polymethine dye or ultraviolet absorber according to claim 8 wherein the azolinylidene is chosen from the class consisting of benzothiazolinylidene, benzoxazolinylidene, quinolinylidene, and benzimadazolinylidene.

10. A polymethine dye or ultraviolet absorber of the formula:

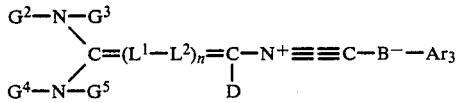

where
Ar is independently in each occurrence an aromatic nucleus containing from 6 to 10 ring carbon atoms;
D is an electron withdrawing group having a cyano, sulfo, or carbonyl group;
$G^2$, $G^3$, $G^4$, and $G^5$ are independently in each occurrence chosen from the class consisting of alkyl, alkenyl, alkynyl, aryl, alkaryl, and aralkyl, wherein said alkyl, alkenyl, and alkynyl moieties contain from 1 to 15 carbon atoms and said aryl moieties contain from 6 to 10 carbon atoms, $G^2$ and $G^3$ together complete a cyclic secondary amine, $G^4$ and $G^5$ together complete a cyclic secondary amine, or $G^2$ and $G^4$ together complete a 5 or 6 membered ring;
$L^1$ and $L^2$ are methine groups; and
n is the integer 0, 1, or 2.

11. A polymethine dye or ultraviolet absorber according to claim 10 wherein
n is 0 and
D is a —C≡N, —S(O)$_2$OR, —C(O)R, or —C(O)OR; and
R is independently in each occurrence chosen from the class consisting of alkyl, alkenyl, alkynyl, aryl, alkaryl, and aralkyl, wherein said alkyl, alkenyl, and alkynyl moieties contain from 1 to 15 carbon atoms and said aryl moieties contain from 6 to 10 carbon atoms.

12. A polymethine dye or ultraviolet absorber according to claim 11 wherein D is —C(O)OR and R is independently in each occurrence alkyl of from 1 to 6 carbon atoms or aryl of 6 to 10 carbon atoms.

13. A polymethine dye or ultraviolet absorber according to claim 10 wherein at least one of $G^2$ and $G^3$ together or $G^4$ and $G^5$ together form a cyclic secondary amine chosen from the group consisting of pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

14. A polymethine dye or ultraviolet absorber selected from the group consisting of
ethyl 4-(3-ethyl-2-benzothiazolinylidene)-2-triphenylborylisocyano-2-butenoate;
ethyl 4-(3-ethyl-2-benzothiazolinylidene)-2-tri(p-fluorophenyl)borylisocyano-2-butenoate;
ethyl 2-(3-ethyl-2-benzothiazolinylidene)-2-tritriphenylborylisocyanoacetate;
ethyl 2-(3-ethyl-2-benzothiazolinylidene)-2-tritri(p-fluorophenyl)borylisocyanoacetate;
ethyl 6-(3-ethyl-2-benzothiazolinylidene)-2-tritriphenylborylisocyano-2,4-hexadienoate;
ethyl 6-(3-ethyl-2-benzothiazolinylidene)-2-tritri(p-fluorophenyl)borylisocyano-2,4-hexadienoate;
3-ethyl-2-(1-triphenylborylisocyano-1-phenylsulfonyl-1-propen-3-ylidene)benzothiazoline;
ethyl 4-(3-ethyl-2-benzoxazolinylidene)-2-triphenylborylisocyano-2-butenoate;
ethyl 4-(3-ethyl-2-benzoxazolinylidene)-2-tri(p-fluorophenyl)borylisocyano-2-butenoate;
ethyl 6-(3-ethyl-2-benzoxazolinylidene)-2-triphenylborylisocyano-2,4-hexadienoate;
ethyl 6-(3-ethyl-2-benzoxazolinylidene)-2-tri(p-fluorophenyl)borylisocyano-2,4-hexadienoate;
2-[1-Cyano-1-tri(p-fluorophenyl)borylisocyano-1-propen-3-ylidene]-3-ethylbenzoxazoline;
ethyl 4-(3-ethyl-2-selenazolinylidene)-2-triphenylborylisocyano-2-butenoate;
ethyl 4-(3-ethyl-2-benzoselenazolinylidene)-2-tri(p-fluorophenyl)borylisocyano-2-butenoate;
methyl 2-(3-ethyl-2-benzotellurazolinylidene)-2-triphenylborylisocyanoacetate;
ethyl 4-(1-ethyl-2-quinolinylidene)-2-triphenylborylisocyano-2-butenoate;
ethyl 4-(1-ethyl-2-quinolinylidene)-2-tri-(p-fluorophenyl)borylisocyano-2-butenoate;
methyl 4-(1-methyl-2-pyridylidene)-2-tri(p-fluorophenyl)borylisocyano-2-butenoate;
ethyl 4-(5,6-dichloro-1,3-diethyl-2-benzimidazolinylidene)-2-triphenylborylisocyano-2-butenoate;
ethyl 4-(5,6-dichloro-1,3-diethyl-2-benzimidazolinylidene)-2-tri(p-fluorophenyl)-borylisocyano-2-butenoate;
ethyl 4-[3,3-dimethyl-1-ethyl-2(3H)-indolylidene]-2-triphenylborylisocyano-2-butenoate;
ethyl 2-(4,5-dihydronaphtho[1,2-d]-1,3-dithiol-2-ylidene)-2-triphenylborylisocyanoacetate;
ethyl 2-(4,5-dihydronaphtho[1,2-d]-1,3-dithiol-2-ylidene)-2-tri(p-fluorophenyl)borylisocyanoacetate;

ethyl 4-(4,6-diphenyl-2-pyranylidene)-2-triphenylborylisocyano-2-butenoate;

ethyl 4-(4,6-diphenyl-2-pyranylidene)-2-tri(p-fluorophenyl)borylisocyano-2-butenoate;

ethyl 4-(2,6-di-t-butyl-4-selenapyranylidene)-2-tri(p-fluorophenyl)borylisocyano-2-butenoate;

ethyl 2-(2,6-diphenyl-4-tellurapyranylidene)-2-triphenylborylisocyanoacetate;

ethyl 4-(2-phenyl-4-benzothiapyranylidene)-2-tri(p-fluorophenyl)borylisocyano-2-butenoate;

ethyl 4-(2,6-diphenyl-4-pyranylidene)-2-triphenylborylisocyano-2-butenoate;

ethyl 4-(2,6-diphenyl-4-pyranylidene)-2-trifluorophenylborylisocyano-2-butenoate;

ethyl 4-(1-ethyl-4-quinolinylidene)-2-triphenylborylisocyano-2-butenoate;

ethyl 4-(1-ethyl-4-quinolinylidene)-2-tri(p-fluorophenyl)borylisocyano-2-butenoate;

ethyl 3-dimethylamino-2-triphenylborylisocyano-2-propenoate;

ethyl 3-dimethylamino-2-tri(p-fluorophenyl)borylisocyano-2-propenoate;

methyl 3-dimethylamino-2-tri(p-tolyl)borylisocyano-2-propenoate ethyl 3,3-bis(dimethylamino)-2-triphenylborylisocyano-2-propenoate;

ethyl 3,3-bis(dimethylamino)-2-tri(p-fluorophenyl)borylisocyano-2-propenoate;

methyl 5-dimethylamino-2-triphenylborylisocyano-2,4-pentadienoate ethyl 2-(1,3-dimethyl-2-imidazolidinylidene)-2-triphenylborylisocyanoacetate; and ethyl 2-(1,3-dimethyl-2-imidazolidinylidene)-2-tri(p-fluorophenyl)borylisocyanoacetate.

15. An imaging composition comprised of an ultraviolet responsive imaging material and a photosensitizer for rendering said imaging material responsive to the visible spectrum
characterized in that said photosensitizer is a polymethine dye according to claim 1.

16. A silver halide photographic element comprised of
a support,
one or more hydrophilic colloid layers on said support including at least one radiation-sensitive silver halide emulsion layer, and
a polymethine dye or ultraviolet absorber according to claim 1.

17. A photographic imaging system comprised of
an imaging dye or precursor thereof,
a hardenable organic component containing ethylenic unsaturation sites and capable of imagewise modulating mobility of said dye or dye precursor as a function of addition at the sites of ethylenic unsaturation, and
coinitiators for ethylenic addition comprised of
an azinium salt activator and
a polymethine dye according to claim 1.

18. A negative working photoresist comprised of
an organic film forming component containing ethylenic unsaturation and capable of selective immobilization by addition at the site of ethylenic unsaturation and
coinitiators for ethylenic addition comprised of
an azinium salt activator and
a polymethine dye according to claim 1, said dye exhibiting a reduction potential which in relation to that of said azinium salt activator is at most 0.1 volt more positive.

* * * * *